United States Patent [19]

Zook

[11] Patent Number: 5,491,701
[45] Date of Patent: Feb. 13, 1996

[54] BURST ERROR CORRECTOR

[75] Inventor: Christopher P. Zook, Longmont, Colo.

[73] Assignee: Cirrus Logic, Inc., Fremont, Calif.

[21] Appl. No.: 325,850

[22] Filed: Oct. 18, 1994

Related U.S. Application Data

[63] Continuation-in-part of Ser. No. 148,068, Nov. 4, 1993, abandoned.

[51] Int. Cl.$^6$ .................................................. G06F 11/10
[52] U.S. Cl. ...................................... 371/39.1; 371/37.7
[58] Field of Search ............................... 371/39.1, 37.4, 371/37.5, 37.7, 38.1, 41, 44, 45

[56] References Cited

U.S. PATENT DOCUMENTS

| | | | |
|---|---|---|---|
| 4,680,764 | 7/1987 | Suzuki et al. | 371/37.5 |
| 4,782,490 | 11/1988 | Tenengolts | 371/37.5 |
| 5,157,669 | 10/1992 | Yu et al. | 371/37.7 |
| 5,172,380 | 12/1992 | Odaka | 371/37.4 |
| 5,241,546 | 8/1993 | Peterson et al. | 371/37.5 |

OTHER PUBLICATIONS

Chang et al., "Cyclic Memory Record Format Without Intrarecord Gaps", IBM Technical Disclosure Bulletin, vol. 19, No. 10, pp. 3890–3891, Mar. 1977.

*Primary Examiner*—Roy N. Envall, Jr.
*Assistant Examiner*—Steven R. Garland
*Attorney, Agent, or Firm*—Nixon & Vanderhye

[57] ABSTRACT

A burst error correction system comprising a CRC generator/checker; a syndrome/ECC generator; and an error corrector. Using codeword data, the CRC generator/checker generates m number of CRC bytes. The CRC bytes are shifted out to the syndrome/ECC generator for use in the generation of a plurality of ECC bytes. In a write operation, syndrome/ECC generator groups the data bytes and the CRC bytes for each codeword into a predetermined number of interleaves. The ECC bytes are generated so that the sum of the bytes in each interleave for a codeword is zero, and so that the ECC bytes generated by the syndrome/ECC generator constitute at least L number of consecutive roots of the codeword. The syndrome/ECC generator comprises an interleave dependent ECC factor subgenerator and two interleave independent ECC factor subgenerators. In the general processing of a read codeword, in a first state of operation the entire codeword is inputted, for regenerating CRC bytes (and adding the regenerated bytes to the received CRC bytes of the codeword, thereby yielding CRC check remainder bytes) and for generating syndromes. The syndromes are utilized to determine if the codeword is correct or if an error burst has occurred. When a portion of an error burst occurs in the data portion, a data error burst processing and correction state is begun. When a portion of the error burst occurs in the CRC portion, a CRC error burst processing state is begun.

29 Claims, 11 Drawing Sheets

BURST ERROR CORRECTOR

CROSS-REFERENCES TO RELATED APPLICATIONS

This patent application is a continuation in part of application of U.S. patent application Ser. No. 08/148,068, filed Nov. 4, 1993, now abandoned, which is incorporated herein by reference. Patent applications filed concurrently (inventor: Christopher P. Zook) with this patent application and incorporated herein by reference include U.S. patent application Ser. No. 08/325,717 entitled "CYCLIC REDUNDANCY CHECK METHOD AND APPARATUS", U.S. patent application Ser. No. 08/326,164 entitled "REED SOLOMON DECODER"; and U.S. patent application Ser. No. 08/325,831 entitled "FINITE FIELD INVERSION", and U.S. patent application Ser. No. 08/326,126 entitled "ERROR CORRECTION METHOD AND APPARATUS". Patent applications filed concurrently with U.S. patent application Ser. No. 08/148,068 (and all hereby incorporated herein by reference) include U.S. patent application Ser. No. 08/147,865 entitled "DUAL PURPOSE CYCLIC REDUNDANCY CHECK", U.S. patent application Ser. No. 08/147,650, now abandoned, entitled "REED SOLOMON DETECTOR"; and U.S. patent application Ser. No. 08/147,758, now abandoned, entitled "FINITE FIELD INVERSION".

BACKGROUND

1. Field of Invention

This invention relates generally to digital data communication systems, particularly to the encoding and decoding of error correcting codes.

2. Related Art and Other Considerations

In a digital data communication system (including storage and retrieval from optical or magnetic media) in order to increase the transfer rate of information and at the same time make the error rate arbitrarily low, it is necessary to employ an error control system. For fixed signal-to-noise ratios and fixed bandwidths improvements can be made through the use of error-correcting codes.

With error-correction coding the data to be transmitted or stored is mathematically processed through appropriate circuitry and/or software to obtain additional data symbols called check symbols or redundancy symbols. The data and check symbols together make up a codeword. After the codeword is transmitted to and received from the communication channel or retrieved from storage the codeword is mathematically processed to obtain error syndromes which contain information about locations and values of errors.

Some applications, e.g. the writing and reading of ID fields on magnetic disk, necessitate the use of codes which can quickly correct short bursts in a small block of data in real time.

For fast burst correction the related art generally employs one of two methods: 1) decoding a multiple-error correcting code (e.g. a Reed-Solomon code) using burst trapping; and 2) interleaving a single-error correcting code. The first method is described in Peterson's and Weldon's "Error-Correcting Codes", second edition, published by the MIT Press, p. 364 and the second method is described on page 357 of that text.

For applications wherein the codeword is transmitted or stored in serial format, e.g. magnetic disk, the byte correcting ability of the code causes an inefficiency. For example, if the code is based on 8-bit symbols, then a two byte correcting code employing burst trapping can guarantee to correct a 9-bit burst since a 10-bit burst could affect three bytes. If the code were based on 4-bit symbols and could correct a 4-symbol burst then all single 13-bit bursts could be corrected but the maximum length of the codeword would be reduced from 255 bytes to 7.5 bytes.

If the interleaving method is used such that a codeword capable of correcting a single 4-bit symbol is interleaved to degree four then all single 13-bit bursts could be corrected and the codeword length would be 30 bytes.

The disadvantage of the interleaving method is that whereas the burst trapping code in the first example has a minimum distance of nine, the individual codewords of the interleaving method in the second example each have minimum distance of three. This means that the first code can correctly detect as uncorrectable all random errors of two, three or four symbols but the second code can fail to detect such errors if they are contained entirely within one interleave. Also each additional redundancy symbol which is added to the first code increases the minimum distance by one but there is no way to add an additional redundancy symbol to the second code which will increase the minimum distance by one.

SUMMARY

A burst error correction system which comprises a CRC generator/checker; a syndrome/ECC generator; and error corrector. The burst error correction system is particular, but not exclusively, suitable for correcting error bursts occurring in header data, including sector ID data, obtained from a storage media, for example.

In the general processing of a codeword during a write operation, data bytes comprising the data polynomial $D(x)$ are applied to the CRC generator/checker both for routing to the syndrome/ECC generator and for use by the CRC generator/checker in generating m number of CRC bytes, e.g., three CRC bytes $CR_0$, $CR_1$, and $C_2$ in the illustrated embodiment. The CRC bytes are shifted out to the syndrome/ECC generator for use in the generation of a plurality of ECC bytes.

In the write operation, the syndrome/ECC generator is configured to group the data bytes and the CRC bytes for each codeword into a predetermined number (L) of interleaves. In the illustrated embodiment, the predetermined number (L) of interleaves is three. The ECC bytes are generated so that the sum of the bytes in each interleave for a codeword is zero, and so that the ECC bytes generated by the syndrome/ECC generator constitutes at least L number of consecutive roots of the codeword. In the illustrated embodiment, the syndrome/ECC generator generates five ECC bytes, the five ECC bytes being generated to cause each interleave to have $\alpha^0$ as a root and to cause the codeword to have $\alpha^1$ and $\alpha^{-1}$ as a root.

The syndrome/ECC generator comprises an interleave-dependent ECC factor sub-generator and two interleave-independent ECC factor sub-generators. The interleave-dependent ECC factor sub-generator generates bytes $E_2$–$E_4$. ECC factors generated by the first and second interleave-independent ECC factor sub-generators are used to generate ECC byte $E_0$ and ECC byte $E_1$.

In the general processing of a read codeword, in a first state of operation the entire codeword is inputted for the purposes of regenerating CRC bytes (using the CRC generator/checker) and of generating syndromes (using the syndrome/ECC generator). The regenerated CRC bytes are added to the received CRC byes of the codeword, yielding CRC check remainder bytes. Thereafter, the syndromes are utilized to determine if an error burst has occurred.

An error burst can occur entirely in the data portion of the codeword, entirely in the CRC portion of the codeword, or can bridge the data portion and CRC portion of the codeword (e.g., one or two bytes of data and one or two bytes of CRC). When at least a portion of an error burst occurs in the data portion of the codeword, a data error burst processing & correction state is begun. The data error burst processing & correction state involves applying the error pattern, for the next three clocks, to the CRC generator/checker for generating further CRC bytes over the error pattern.

When a portion of the error data burst occurs in the CRC portion of the codeword, a CRC error burst processing state is begun. The CRC error burst processing state involves applying the error pattern bytes developed during a phase of operation known as CRC_TIME to the CRC generator/checker for the purpose of adding the error pattern with the CRC check remainder bytes. If the burst error occurred only in the CRC portion of the codeword, the result of the addition will be zero if the codeword is correctable. If the burst error bridged the data portion of the codeword and the CRC portion of the codeword, the CRC error burst processing state is first begun and the data error burst processing & correction state is subsequently but concurrently entered. When, in connection with the CRC error burst processing state, the CRC generator/checker adds the portion of the error pattern outputted during CRC_TIME with the CRC check remainder bytes, for the codeword to be deemed correctable the result must equal the CRC bytes generated over the data portion of the error pattern.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

The invention includes a method and apparatus capable of generating redundancy symbols and syndromes and using the syndromes to correct errors. The codeword, C(x) consists of data bytes, CRC bytes and ECC bytes. The data bytes are the first bytes in the codeword. The CRC bytes follow the data bytes. The ECC bytes follow the CRC bytes. C(x) is defined as:

$$C(x) = \sum_{n=0}^{s-1} D_n X^{n+m+5} + \sum_{n=0}^{m-1} CR_x X^{n+5} + \sum_{n=0}^{4} E_n X^n$$

where $CR_n$ are the CRC bytes, $D_n$ are the data bytes, $E_n$ are the ECC bytes, s is the number of data bytes and m is the number of CRC bytes. In the illustrated embodiment, s=8, m=3, and the field generator polynomial is $G(X)=X^8+X^4+X^3+X^2+1$. It should be understood that the invention is not confined to these exemplary values and polynomial, and that other values and polynomials may be utilized within the spirit of the invention.

The CRC bytes are defined as:

$$CR_k = \sum_{n=0}^{s-1} D_n X^{n+1} \mod(X + \alpha^{2+k}) \qquad \text{EQN. 1}$$

for k=0 to m−1. The CRC bytes are only generated over the data bytes. The $E_2$, $E_3$ and $E_4$ bytes are parity bytes over the entire codeword (including CRC bytes) divided into three interleaves and are generated in such a way so as to make the sum of the bytes in each interleave equal to 0, i.e.

$$\sum_{n=0}^{i_k} C_{3n+k} = 0 \qquad \text{EQN. 2}$$

where $C_{3n+k}$ are the coefficients of C(x) and $i_k$ is one less than the number of bytes in the kth interleave, i.e. $i_k$ is the largest integer that allows $3i_k$ to be less than s+m+5−k. $E_0$ and $E_1$ are defined by:

$$E_1 X + E_0 = \sum_{n=2}^{s+m+4} C_n X^n \mod(X + \alpha^1) \quad (X \neq \alpha^{-1}) \qquad \text{EQN. 3}$$

$E_2$, $E_3$ and $E_4$ cause $\alpha^0$ to be a root of each of the interleaves. The ECC bytes $E_0$ and $E_1$ are generated so that $a^{-1}$ and $\alpha^1$ are codeword roots. The CRC roots start at $\alpha^2$. Therefore the minimum distance is 4+m (the number of consecutive roots +1).

STRUCTURE: OVERVIEW

Figure 1:
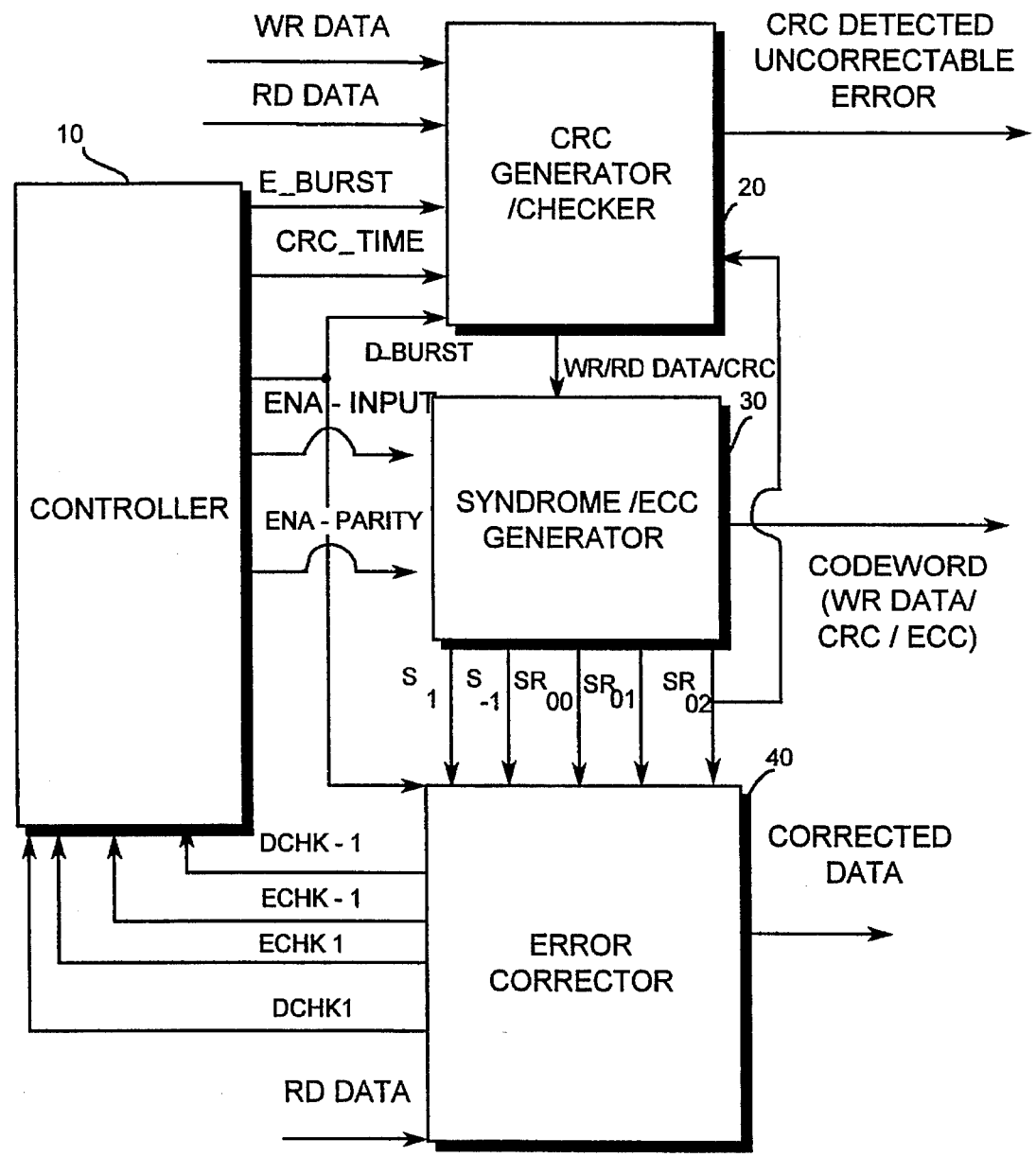
FIG. 1 is a schematic block diagram view of a burst error correction system according to an embodiment of the invention.

FIG. 1 shows an burst error correction system which comprises controller 10; CRC generator/checker 20; syndrome/ECC generator 30; and error corrector 40. CRC generator/checker 20, syndrome/ECC generator 30, and error corrector 40 are described in more detail in connection with FIG. 2, FIG. 3, and FIG. 4, respectively.

STRUCTURE: CRC GENERATOR/CHECKER

Figure 2:
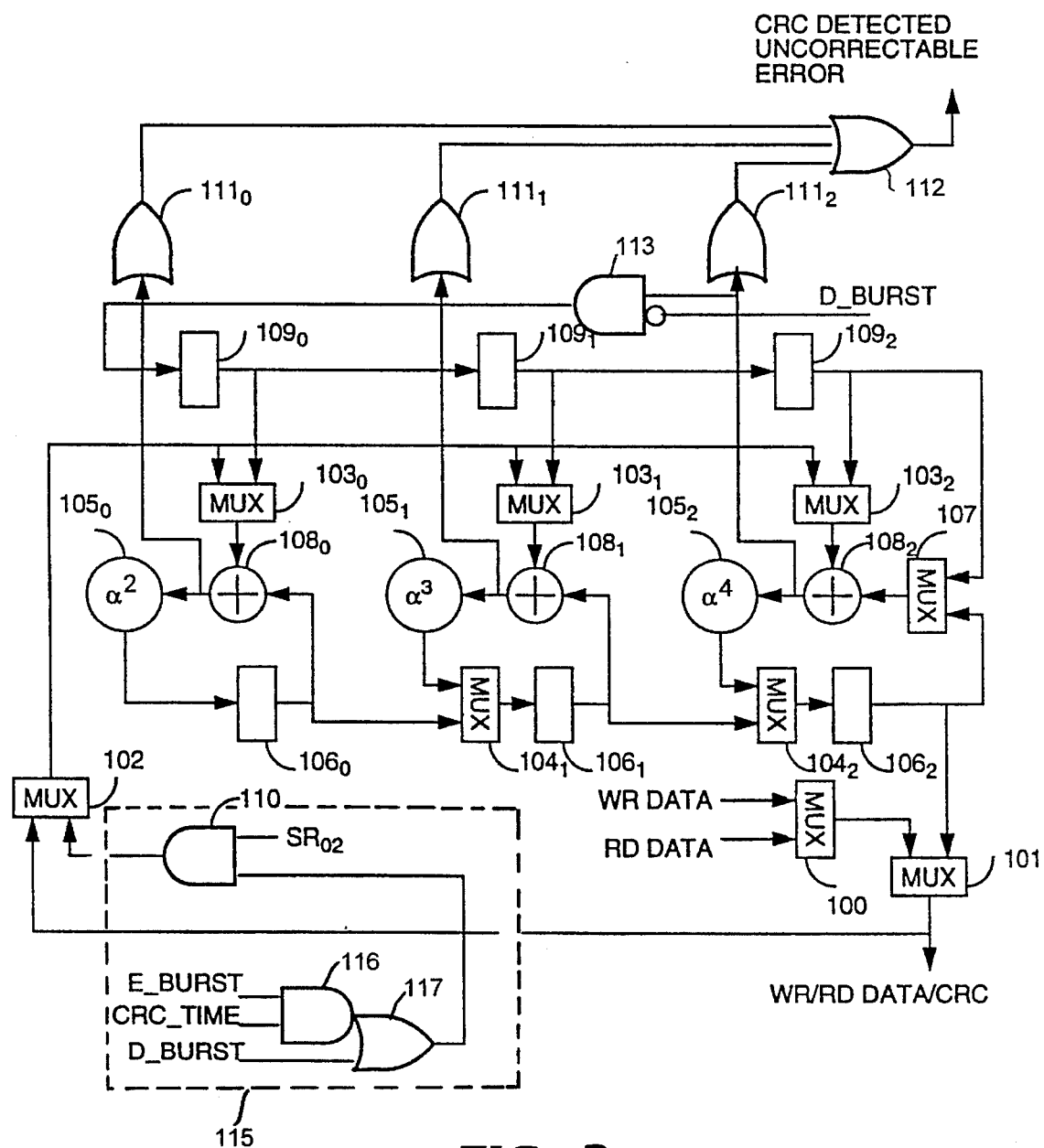
FIG. 2 is a schematic block diagram of a CRC generator of the embodiment of FIG. 1.

As shown in FIG. 2, CRC generator/checker includes an input switch or MUX 100 connected to receive either read data on line RD DATA or data-to-be-written on line WR DATA. An output terminal of MUX 100 is connected to a first input terminal of data/CRC selection switch (MUX) 101. An output terminal of MUX 101 is connected both to syndrome/ECC generator 30 (by line WR/RD DATA/CRC) and to data/error switch (MUX) 102. An output terminal of MUX 102 is connected to each of three CRC generator circuits as described below.

As shown in FIG. 2, a first CRC generator circuit has reference numerals which include "0" subscripts. Second and third CRC generator circuits have reference numerals which include "1" and "2" as subscripts, respectively. Each CRC generator circuit includes an input MUX 103; a constant feedback multiplier 105; a register 106; and an adder 108. The second and third CRC generator circuits each have a shift-select MUX 104. The third CRC generator circuit has a error-select MUX 107. In general, a first input terminal of input MUX 103 of each CRC generator circuit is connected to the output terminal of data/error switch (MUX) 102. An output terminal of input MUX 103 is connected to a first terminal of adder 108, the second terminal of adder being connected to an output terminal of register 106 (selectably via MUX 107 in the case of the third CRC generator circuit). An output terminal of adder 108 is connected to the feedback multiplier 105, which in turn has an output terminal connected to an input of register 106 (via MUX 104 in the case of the second and third CRC generator circuits).

As subsequently described, CRC generator/checker 20 generates three CRC bytes, i.e., $CR_0$, $CR_1$, and $CR_2$, in registers $106_0$, $106_1$, and $106_2$, respectively. Since these three CRC bytes are shifted out to syndrome/ECC generator 30 via MUX 101 and line WR/RD DATA/CRC, provision is made for shifting the CRC bytes through the registers 106. In this regard, the output terminal of register $106_0$ is connected to a second input terminal of shift-select MUX $104_1$ for loading into register $106_1$ and the output terminal of register $106_1$ is connected to a second input terminal of shift-select MUX $104_2$ for loading into register $106_2$.

Paired with each CRC generator circuit is a check register 109 and a check gate (e.g., OR gate) 111. In particular, the output terminal of adder 108 of each circuit is connected to the input terminals of its associated (i.e., like subscripted) check gate 111. The output terminals of OR gates $111_0$, $111_1$, and $111_2$ are connected to a three-input check gate 112. A signal CRC DETECTED UNCORRECTABLE ERROR is output by check gate 112.

Output terminals of associated (i.e., like subscripted) check registers 109 are connected to second input terminals of input MUXes 103. The check registers 109 are connected whereby the contents thereof are shiftable (e.g., from register $109_0$ to register $109_1$; from register $109_1$ to register $109_2$) so that the contents of each register can ultimately be fed via the second input terminal of error-select MUX 107 to adder $108_2$ of the third CRC generator circuit. Register $109_0$ is fed from AND gate 113, which has a first input terminal connected to receive (and invert) a signal D_BURST (described subsequently with reference to FIG. 4). A second input terminal of AND gate 113 is connected to the output terminal of adder $108_2$ of the third CRC generator circuit.

CRC generator/checker 20 of FIG. 2 also includes an error pattern introduction control section (framed by broken line 115). Error pattern introduction control section includes AND gate 110; AND gate 116; and OR gate 117. AND gate 116 has its two input terminals connected to receive signals on lines E_BURST and CRC_TIME, respectively. An output terminal of AND gate 116 is connected to a first input terminal of OR gate 117, a second input terminal of OR gate 117 being connected to receive a signal on line D_BURST. The signals on lines D_BURST and E_BURST are subsequently described with reference to FIG. 4. An output terminal of OR gate 117 is connected to a first input terminal of AND gate 110, the second input terminal of AND gate 110 being connected to receive an error pattern on line $SR_{02}$ (understood hereinbelow with reference to FIG. 3).

FIG. 2 further shows employment of appropriately differing feedback multiplier constants for multipliers $105_0$, $105_1$, and $105_2$. In particular, multiplier $105_0$ has the constant $\alpha^2$; multiplier $105_1$ has the constant $\alpha^3$; and multiplier $105_2$ has the constant $\alpha^4$.

STRUCTURE: SYNDROME/ECC GENERATOR

Figure 3:
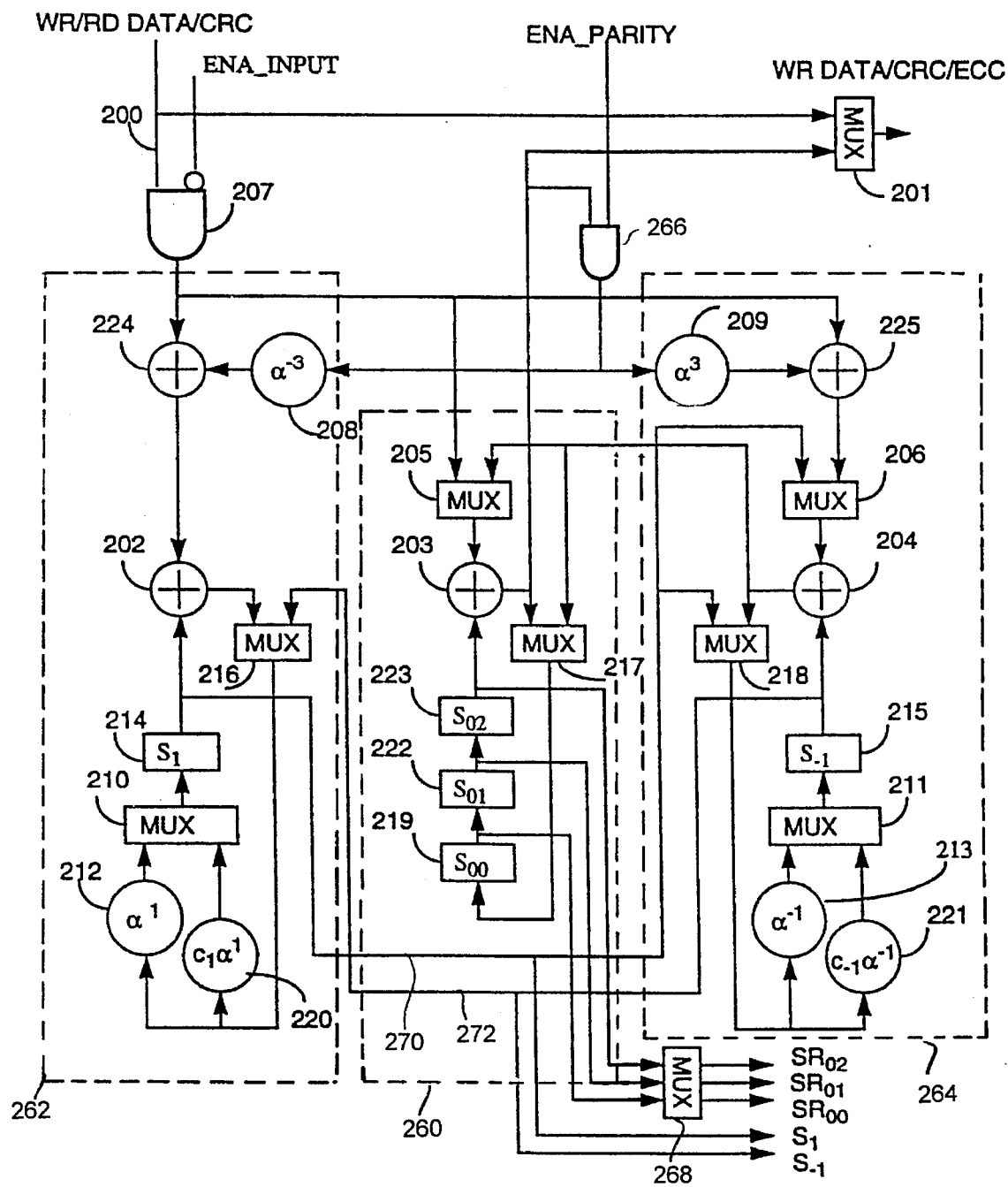
FIG. 3 is a schematic block diagram of a syndrome/ECC generator of the embodiment of FIG. 1.

Syndrome/ECC generator 30 of FIG. 3 generates a plurality of ECC bytes, the plurality in the illustrated embodiment being five ECC bytes. As explained below, syndrome/ECC generator 30 is configured to group the data bytes (applied on line WR/RD DATA/CRC) and the CRC bytes (generated by CRC generator/checker 20) for each codeword into a predetermined number (L) of interleaves. In the illustrated embodiment, the predetermined number (L) of interleaves is three. The ECC bytes are generated so that the sum of the bytes in each interleave for a codeword is zero, and so that the ECC bytes generated by the syndrome/ECC generator 30 constitutes at least L number of consecutive roots of the codeword. In the illustrated embodiment, syndrome/ECC generator 30 generates five ECC bytes, the five ECC bytes being generated to cause each interleave to have $\alpha^0$ as a root and to cause the codeword to have $\alpha^1$ and $\alpha^{-1}$ as a root.

As shown in FIG. 3, syndrome/ECC generator 30 comprises an interleave-dependent ECC factor sub-generator 260 and two interleave-independent ECC factor sub-generators 262 and 264. Syndrome/ECC generator 30 generates five ECC bytes $E_0$–$E_4$. Interleave-dependent ECC factor sub-generator 260 generates bytes $E_2$–$E_4$. ECC factors generated by the first and second interleave-independent ECC factor sub-generators 262, 264, respectively, are used to generate ECC byte $E_0$ and ECC byte $E_1$.

Syndrome/ECC generator 30 also includes an enable input AND gate 207; an enable parity AND gate 266; an output (WR DATA/CRC/ECC) MUX 201; and parity sum register output MUX 268.

Enable input AND gate 207 has its first input terminal connected to CRC generator/checker 20 by line 200 (WR/RD DATA/CRC) and its second (inverting) input terminal connected to controller 10 by line ENA_INPUT. An output terminal of enable input AND gate 207 is connected by adder 224 to sub-generator 262; to sub-generator 260; and by adder 225 to sub-generator 264.

Enable parity AND gate 266 has its first input terminal connected to controller 10 by a line ENA_PARITY. A second input terminal of AND gate 266 is connected to receive ECC bytes from sub-generator 260 in a manner hereinafter discussed. An output terminal of AND gate 266 is connected to sub-generators 262 and 264.

Interleave dependent ECC factor sub-generator 260 comprises L number of interleave parity sum registers, in particular parity sum registers 219, 222, and 223 (it being recalled that L=3 in the illustrated embodiment). Sub-generator 260 further includes adder 203 for adding an input byte applied to the interleave-dependent ECC factor sub-generator 260 to contents of a selected one of the interleave parity Sum registers 219, 222, and 223. Interleave dependent ECC factor sub-generator 260 is configured so that the interleave parity sum registers 219, 222, and 223 are connected whereby each interleave parity sum register has an input byte added thereto by the adder every Lth clock cycle.

Interleave dependent ECC factor sub-generator 260 also includes adder input MUX 205 and register input MUX 217. Adder input MUX 205 has a first input terminal connected to AND gate 207 whereby data bytes and CRC bytes are applied to sub-generator 260. A second input terminal of adder input MUX 205 is connected to sub-generator 264 as hereinafter described. An output terminal of adder input MUX 205 is connected to a first input terminal of adder 203. An output terminal of adder 203 is connected to a first input terminal of register input MUX 217, to enable parity AND gate 266; to constant multipliers 208 and 209 in sub-generators 262 and 264, respectively; and to output (WR DATA/CRC/ECC) MUX 201. A second input terminal of register input MUX 217 is connected to sub-generator 264. An output terminal of register input MUX 217 is connected to an input terminal of register 219, with register 219 having its output terminal connected to the input terminal of register 222, register 222 having its output terminal connected to register 223, and register 223 having its output terminal connected to the second input terminal of adder 203.

The interleave-independent ECC factor sub-generators 262, 264 each generate interleave-independent ECC factors for use in developing ECC bytes $E_0$ and $E_1$. As subsequently explained, the interleave-independent ECC factors of sub-generators 262 and 264 are ultimately transferred to at least one of the interleave parity sum registers 219, 222, 223 in a process of outputting the ECC bytes from syndrome/ECC generator 30.

Interleave-independent ECC factor sub-generator 262 includes an $S_1$ syndrome generator which comprises $S_1$ syndrome register 214; $S_1$ syndrome first adder 202; $S_1$ syndrome first feedback multiplier 212; and $S_1$ syndrome second adder 224. Interleave-independent ECC factor sub-generator 262 further includes a multiplier input MUX 216 and a multiplier select MUX 210, as well as a second feedback multiplier 220 and a constant multiplier 208.

The $S_1$ syndrome first adder 202 is connected to add together contents of $S_1$ syndrome register 214 and an input byte applied to the $S_1$ syndrome generator (via adder 214 from gate 207). An output terminal of first adder 202 is connected to a first input terminal of multiplier input MUX 216, a second input terminal of input MUX 216 being connected to sub-generator 264 as hereinafter described. An output terminal of multiplier input MUX 216 is connected both to first feedback multiplier 212 and second feedback multiplier 220. First feedback multiplier 212 multiplies by the constant $\alpha^1$ while the second feedback multiplier 220 multiplies by the constant $c_1\alpha^1$. Thus, the $S_1$ syndrome first feedback multiplier 212 serves for multiplying the output of the $S_1$ syndrome first adder by a first multiplication constant (i.e., $\alpha^1$).

The $S_1$ syndrome second adder 224 is connected to constant multiplier 208 for adding a constant multiple (i.e., $\alpha^{-3}$) of a parity sum to the input byte applied to the $S_1$ syndrome generator when the input byte applied to the $S_1$ syndrome generator is any of the last three bytes of the codeword immediately preceding ECC bytes. The input terminal of constant multiplier 208 is connected to the output terminal of adder 203 of sub-generator 260.

The interleave-independent ECC byte sub-generator 264 generates a syndrome $S_{-1}$ and has analogous structure to sub-generator 262, as well as an additional multiplexer 206. In particular, interleave-independent ECC byte sub-generator 264 includes an $S_{-1}$ syndrome generator which comprises $S_{-1}$ syndrome register 215; $S_{-1}$ syndrome first adder 204; $S_{-1}$ syndrome first feedback multiplier 213; and, $S_{-1}$ syndrome second adder 225. Interleave-independent ECC factor sub-generator 264 further includes a multiplier input MUX 218 and a multiplier select MUX 211, as well as a second feedback multiplier 221 and a constant multiplier 209. The $S_{-1}$ syndrome first feedback multiplier 213 serves for multiplying the output of the $S_{-1}$ syndrome first adder 204 by a first multiplication constant (i.e., $\alpha^{31\ 1}$). The $S_{-1}$ syndrome second adder 225 is connected to constant multiplier 209 for adding a constant multiple (i.e., $\alpha^3$) of a parity sum to the input byte applied to the $S_{-1}$ syndrome generator when the input byte applied to the $S_{-1}$ syndrome generator is any of the last three bytes of the codeword immediately preceding ECC bytes. The input terminal of constant multiplier 209 is connected to the output terminal of adder 203 of sub-generator 260.

As shown in FIG. 3, the output terminal of $S_1$ syndrome register 214 (in sub-generator 262) is connected by line 270 to a first input terminal of MUX 218 and to a first input terminal of MUX 206. A second input terminal of MUX 206 is connected to the output terminal of adder 225. A second input terminal of MUX 218 is connected to the output terminal of adder 204. The output terminal of adder 204 is connected to input terminals of MUXes 218, 17, and 205. The output terminal of $S_{-1}$ syndrome register 215 (of sub-generator 264) is connected by line 272 to a second input terminal of MUX 216 (of sub-generator 262).

Output terminals of the parity sum registers 219, 222, and 223 are connected to respective input terminals of parity sum register output MUX 268. MUX 268 has three corresponding output terminals connected to lines $SR_{00}$, $SR_{01}$, and $SR_{02}$, respectively. Lines 270 and 272 are connected to carry signals $S_1$ and $S_{-1}$, respectively.

STRUCTURE: ERROR CORRECTOR

Figure 4:
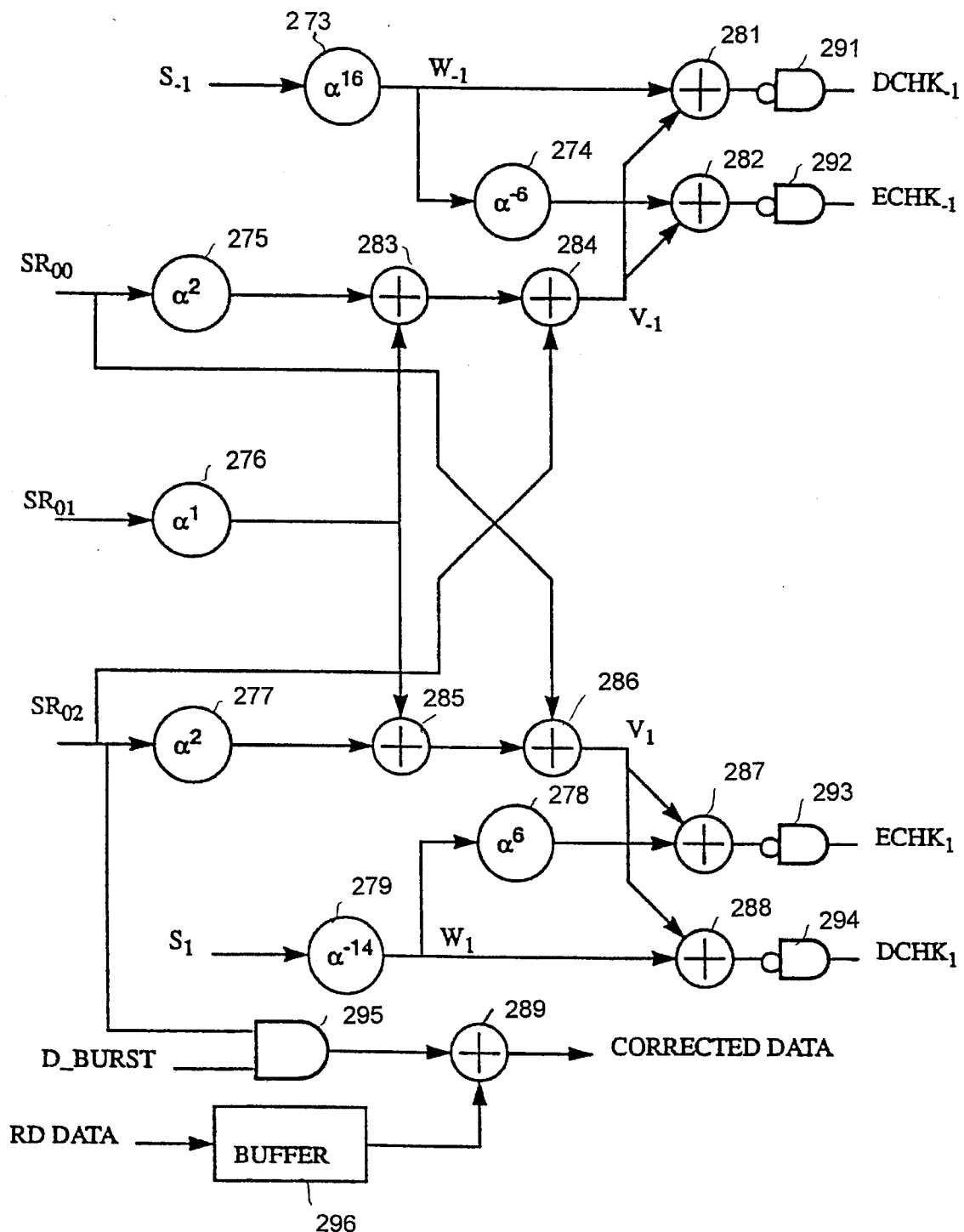
FIG. 4 is a schematic block diagram of an error corrector of the embodiment of FIG. 1

Error corrector 40 is shown in more detail in FIG. 4. Error corrector 40 includes a plurality of constant multipliers 273–279, a plurality of adders 281–289; a plurality of NOR gates 291–294; AND gate 295; and buffer 296. As shown in FIG. 4, multiplier 273 receives signal $S_{-1}$ from register 215 and line 272 of FIG. 3; multiplier 279 receives signal $S_1$ from register 214 and line 270 of FIG. 3; and multipliers 275, 276, and 277 are included as components receiving the signals $SR_{00}$, $SR_{01}$, and $SR_{02}$ from MUX 268 of FIG. 3. While one input terminal of AND gate 295 also receives signal $SR_{02}$, a second input terminal of AND gate 295 receives signal D_BURST from controller 10.

Error corrector 40 generates five output signals, particularly signal CORRECTED DATA and four check signals $DCHK_1$, $ECHK_1$, $DCHK_{-1}$, and $ECHK_{-1}$. The signal CORRECTED DATA is generated by adding together (at adder 289) the input data (i.e., RD_DATA stored in buffer 296) and the output of AND gate 295 (e.g., signal $SR_{02}$).

Tables 1–12 list the XOR logic for each of the constant multipliers used for the burst error correction system of the present invention.

OPERATION: OVERVIEW: WRITE OPERATION

In the general processing of a codeword during a write operation, data bytes comprising the data polynomial D(x) are applied to CRC generator/checker 20 both for routing to syndrome/ECC generator 30 and for use by CRC generator/checker 20 in generating m number of CRC bytes, e.g., three CRC bytes $CR_0$, $CR_1$, and $CR_2$ in the illustrated embodiment. The data bytes $D_n$ are transmitted through MUXes 100 and 101 of CRC generator/checker 20 and applied on line WR/RD DATA/CRC to syndrome/ECC generator 30. After all data bytes $D_n$ have been routed to syndrome/ECC generator 30, the three CRC bytes $CR_2$, $CR_1$, and $CR_0$ (generated on the basis of the data bytes $D_n$) are applied to syndrome/ECC generator 30 (through MUX 101 and line WR/RD DATA/CRC).

Thus, for each codeword, syndrome/ECC generator 30 receives a sequence of data bytes and CRC bytes. Syndrome/ECC generator 30 outputs the entire codeword including the data bytes $D_n$, the three CRC bytes $CR_2$, $CR_1$, and $CR_0$, and five ECC bytes $E_4$–$E_0$ (the five ECC bytes being generated by syndrome/ECC generator 30). The five ECC bytes are also represented as codeword bytes $C_4$–$C_0$, with codeword byte $C_0=E_0$ being the last outputted byte of the codeword, byte $C_1=E_1$ being the next to the last outputted byte of the codeword, and so forth.

In order to generate the ECC bytes $E_4$–$E_0$, syndrome/ECC generator 30 routes the received data bytes $D_n$ and CRC bytes $CR_2$, $CR_1$, and $CR_0$ to each of its three sub-generators 260, 262, and 264. As explained in more detail below, when the CRC bytes are applied to syndrome/ECC generator 30, the enable parity AND gate 266 is turned on (via signal ENA_PARITY from controller 10) so that constant multipliers 208 and 209 become active. Sub-generator 260 splits the incoming data bytes $D_n$ and CRC bytes into three interleaves, and sums the bytes in each interleave to produce parity bytes called $P_2$, $P_3$, and $P_4$. After all data bytes $D_n$ and CRC bytes of the codeword have been applied, parity sum $P_2$ will be stored in register 219 ($S_{00}$); parity sum $P_3$ will be stored in register 222 ($S_{01}$); and parity sum $P_4$ will be stored in register 223 ($S_{02}$). Further, register 214 of sub-generator 262 will contain a quantity $c_1 G_1$ and register 215 of sub-generator 264 will contain a quantity $c_{-1} G_{-1}$, these quantities being utilized as hereinafter described to obtain ECC bytes $E_0$ and $E_1$. As explained hereinafter with reference to EQN. 6, EQN. 7, and EQN 8, the parity sums $P_2$, $P_3$, $P_4$ and bytes $E_0$, $E_1$ are used to obtain the further ECC bytes $E_2$–$E_4$.

OPERATION: ECC DERIVATION MATHEMATICS

Mathematical derivations of significant terms including $G_1$, $G_{-1}$, $E_0$–$E_4$ are now described in more detail. In CRC generator/checker 20, the CRC bytes are obtained by dividing the data polynomial, $D(x)$ whose coefficients are $D_k$, by the individual CRC factors. Then, as explained above, for each codeword, in sub-generator 260 of syndrome/ECC generator 30, a sequence of data bytes and CRC bytes are split into three interleaves and all the bytes in each interleave are summed to produce the parity bytes $P_2$, $P_3$ and $P_4$. The last byte of the data/CRC sequence will have been added to the $P_2$ sum, the next to last byte will have been added to the $P_3$ sum, etc.

In syndrome/ECC generator 30, the sequence consisting of data, CRC, $P_4$, $P_3$ and $P_2$ is multiplied by $X^{-2}$ and then divided by $\alpha^1$ and $\alpha^{-1}$ to produce $G_1$ and $G_{-1}$ respectively such that $$G_1 = \qquad \text{EQN. 4}$$

$$G_{-1} = \frac{\left( \sum_{n=5}^{s+m+4} C_n X^{n-4} + P_4 X^0 + P_3 X^{-1} + P_2 X^{-2} \right) \mod(X = \alpha^1)}{\left( \sum_{n=5}^{s+m+4} C_n X^{n-4} + P_4 X^0 + P_3 X^{-1} + P_2 X^{-2} \right) \mod(X + \alpha^{-1})} \qquad \text{EQN. 5}$$

Syndrome/ECC generator 30 outputs (on line WR DATA/CRC/ECC) the data bytes $D_n$ followed by the CRC bytes $CR_2$, $CR_1$, and $CR_0$. Following the three CRC bytes, the next three bytes out are $E_4$, $E_3$ and $E_2$ where $$E_4 = C_4 = P_4 + E_1 \qquad \text{EQN. 6}$$

$$E_3 = C_3 = P_3 + E_0 \qquad \text{EQN. 7}$$

$$E_2 = C_2 = P_2 \qquad \text{EQN. 8}$$

therefore $E_1$ and $E_0$ must be calculated from $G_1$ and $G_{-1}$ in order to output $E_4$ and $E_3$. From EQN. 3, EQN. 4, EQN. 6, EQN. 7 and EQN.8

$$(E_1(X) + E_0) \mod(X + \alpha^1) = \sum_{n=2}^{s+m+4} C_n X^n \mod(X + \alpha_1) =$$

$$(G_1 + E_1 X^0 + E_0 X^{-1}) X^4 \mod(X + \alpha^1)$$

and since $F(X) \mod(X+c) = F(c)$ $$E_1 \alpha + E_0 = G_1 \alpha^4 + E_1 \alpha^4 + E_0 \alpha^3 \qquad \text{EQN. 9}$$

Similarly, $$(E_1(X) + E_0) \mod(X + \alpha^{-1}) = \sum_{n=2}^{s+m+4} C_n X^n \mod(X + \alpha^{-1}) =$$

$$(G_{-1} + E_1 X^0 + E_0 X^{-1}) X^4 \mod(X + \alpha^{-1})$$

and $$E_1 \alpha^{-1} + E_0 = G_1 \alpha^{-4} + E_1 \alpha^{-4} + E_0 \alpha^{-3} \qquad \text{EQN. 10}$$

Solving EQN. 9 and EQN. 10 yields:

$$E_1 = c_1 G_1 + c_{-1} G_1$$

$$E_0 = c_1 \alpha^{-1} G_1 + c_{-1} \alpha G_{-1}$$

where $$C_1 = \frac{\alpha^4 + \alpha^1}{\alpha^4 + \alpha^2 + \alpha^{-2} + \alpha^{-4}} \qquad \text{EQN. 11}$$

$$C_1 = \frac{\alpha^{-4} + \alpha^{-1}}{\alpha^4 + \alpha^2 + \alpha^{-2} + \alpha^{-4}}$$

OPERATION: DETAIL: WRITE OPERATION

Figure 5:
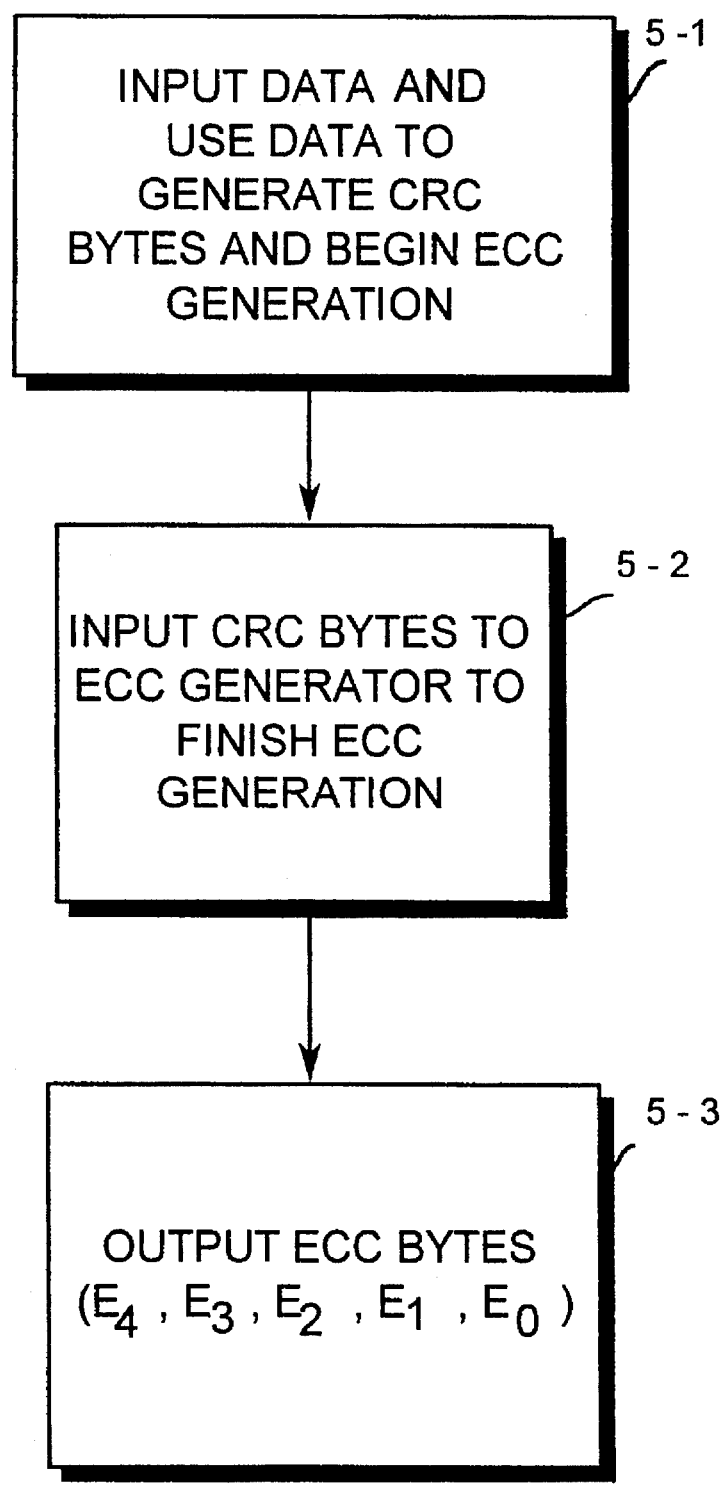
FIG. 5 is a flowchart showing general steps executed when the system of FIG. 1 executes a write operation.

FIG. 5 shows general steps executed when the system of FIG. 1 executes a write operation. At step 5-1, data-to-be written is inputted both for use in generating CRC bytes (by CRC generator/checker 20) and for application to syndrome/ECC generator 30. At step 5-2, the CRC bytes $CR_2$–$CR_0$ generated by CRC generator/checker 20 at step 5-1 are input to syndrome/ECC generator 30 to finish generation of the ECC bytes $E_4$–$E_0$. At step 5-3, the ECC bytes $E_4$–$E_0$ generated by syndrome/ECC generator 30 are outputted in the order $E_4$–$E_0$ ($E_0$ being the last outputted ECC byte).

Considering now step 5-1 of FIG. 5 in more detail, data bytes $D_n$ are applied on line RD DATA to input MUX 100 and data/CRC selection MUX 101 of CRC generator/ checker 20 (see FIG. 2). Data bytes $D_n$ are applied both directly to syndrome/ECC generator 30 (on line WR/RD DATA/CRC) and (via data/error MUX 102 to each of the first, second, and third CRC generator circuits of FIG. 2. The data bytes $D_n$ are admitted to each CRC generator circuit by its MUX 103. In the third CRC generator circuit, MUX 107 connects register $106_2$ to adder $108_2$. While data bytes $D_n$ are being presented, MUXes 104 connect the outputs of the feedback multipliers 105 to the inputs of registers 106 which are initially reset.

After all data bytes have been input, registers 106 will contain the CRC bytes (i.e., register $106_2$ will contain byte $CR_2$; register $106_1$ will contain byte $CR_1$; and register $106_0$ will contain byte $CR_0$). After all data bytes have been input, MUXes 104 switch to allow the CRC bytes stored in registers 106 to be shifted out to the syndrome/ECC generator 30 via MUX 101.

As shown in FIG. 3, the data bytes $D_n$ and CRC bytes $CR_2$–$CR_0$ are input on lead 200 to syndrome/ECC generator 30. For outputting bytes of the codeword on line WR DATA/CRC/ECC, MUX 201 allows the data bytes $D_n$ and CRC bytes $CR_2$–$C_0$ to be output first followed by the ECC bytes generated by syndrome/ECC generator 30. As seen hereinafter, the ECC bytes $E_4$–$E_0$ are obtained from adder 203 of sub-generator 260.

Data bytes $D_n$ are input to the adders 202, 203 and 204 (of respective sub-generators 262, 260, 264) through AND gate 207 and (for adders 203 and 204) MUXes 205 and 206. The signal ENA_PARITY from controller 10 is OFF while data bytes $D_n$ are being clocked into syndrome/ECC generator 30 on line 200. Accordingly, with the signal ENA_PARITY being OFF, the outputs of constant multipliers 208 and 209 are zero.

During input of data bytes $D_n$, MUX 216 in sub-generator 262 connects adder 202 to multiplier 212. Similarly, in sub-generator 264, MUX 218 connects adder 204 to multiplier 213. In sub-generator 260, MUX 217 connects adder 203 to register 219. During the input of data bytes $D_n$ and the first two CRC bytes (e.g., CRC bytes $CR_2$ and $CR_1$), MUXes 210 and 211 connect the outputs of multipliers 212 and 213, respectively, to the inputs of registers 214 and 215 respectively. All registers are initially reset.

When the three CRC bytes $CR$–$CR_0$ are being received on lead 200 (see step 5-2 in FIG. 5), signal ENA_PARITY is turned ON, thereby allowing the output of adder 203 to be multiplied by constant multipliers 208 and 209 and added to the incoming CRC bytes by adders 224 and 225, respectively. This action allows the inclusion of the parity sums in the $G_1$ and $G_{-1}$ terms as shown in EQN. 4 and EQN. 5. While the last CRC byte (i.e., CRC byte $CR_0$) is being clocked in, MUXes 210 and 211 connect the outputs of multipliers 220 and 221, respectively, to the inputs of registers 214 and 215, respectively. At that point, register 214 will contain $c_1G_1$ and register 215 will contain $c_{-1}G_{-1}$. Moreover, register 223 ($S_{02}$) will contain $P_4$; register 222 ($S_{01}$) will contain $P_3$; and register 219 ($S_{00}$) will contain $P_2$.

After all data bytes $D_n$ and CRC bytes $CR_2$–$CR_0$ have been clocked into syndrome/ECC generator 30, the five ECC bytes $E_4$–$E_0$ are then output (see step 5-3 of FIG. 5). For the next two clocks of step 5-3, MUX 206 is switched to connected the contents of register 214 (i.e., $c_1G_1$) to the first input terminal of adder 204, MUX 205 switches to allow adder 204 to feed adder 203, MUX 217 switches to allow adder 204 to feed register 219, and MUXes 216 and 218 switch to allow registers 215 and 214, respectively, to feed multipliers 212 and 213, respectively.

The switching of MUX 206 generates $E_1$, since the switching of MUX 206 causes adder 204 to add together the contents of register 214 (i.e., $c_1G_1$) and the contents of register 215 (having contents $c_{-1}G_{-1}$), thereby producing $E_1=c_1G_1+c_{-1}G_{-1}$ as set forth above. Byte $E_1$ is applied via MUX 205 to adder 203. Adder 203 then uses $E_1$ and the contents of register 223 ($P_4$) to produce and output ECC byte $E_4$ (which, according to EQN. 6, is $E_1+P_4$). Byte E1 is also stored in register 219 (via MUX 217), the contents of register 219 ($P_2$) being shifted to register 222 and the contents of register 222 ($P_3$) being shifted to register 223.

The switching of MUXes 216 and 218 causes the quantity $c_{-1}\alpha G_{-1}$ to be stored in register 214 and the quantity $c_1\alpha_{-1}G_1$ to be stored in register 215. With MUX 206 switched as above described, adder 204 adds the contents of registers 214 and 215 to produce $E_0=c_1\alpha_{-1}G_1+c_{-1}\alpha G_{-1}$ according to the foregoing solution of EQN. 9 and EQN. 10. ECC byte $E_0$ is then applied to adder 203 (via MUX 205). Adder then uses $E_0$ and the value $P_3$ shifted from register 222 into register 223 to produce and output (via MUX 201) ECC byte $E_3$ according to EQN. 7 (i.e., $E_3=P_3+E_0$). ECC byte $E_0$ is also stored in register 219 (the ECC byte $E_1$ previously stored in register 219 now being shifted to register 222 and the contents of register 222 [$P_2$] being shifted to register 223).

After the two afore-described clocks, registers 223, 222, and 219 contain $E_2=P_2$ (see EQN. 8), $E_1$, and $E_0$, respectively. The values $E_2$, $E_1$, and $E_0$ are then shifted out via MUX 201 to line WR DATA/CRC/ECC during the final three clocks by turning OFF signal ENA_PARITY and switching MUX 205 back to connect gate 207 to adder 203.

OPERATION: OVERVIEW: READING OPERATION

Figure 6:
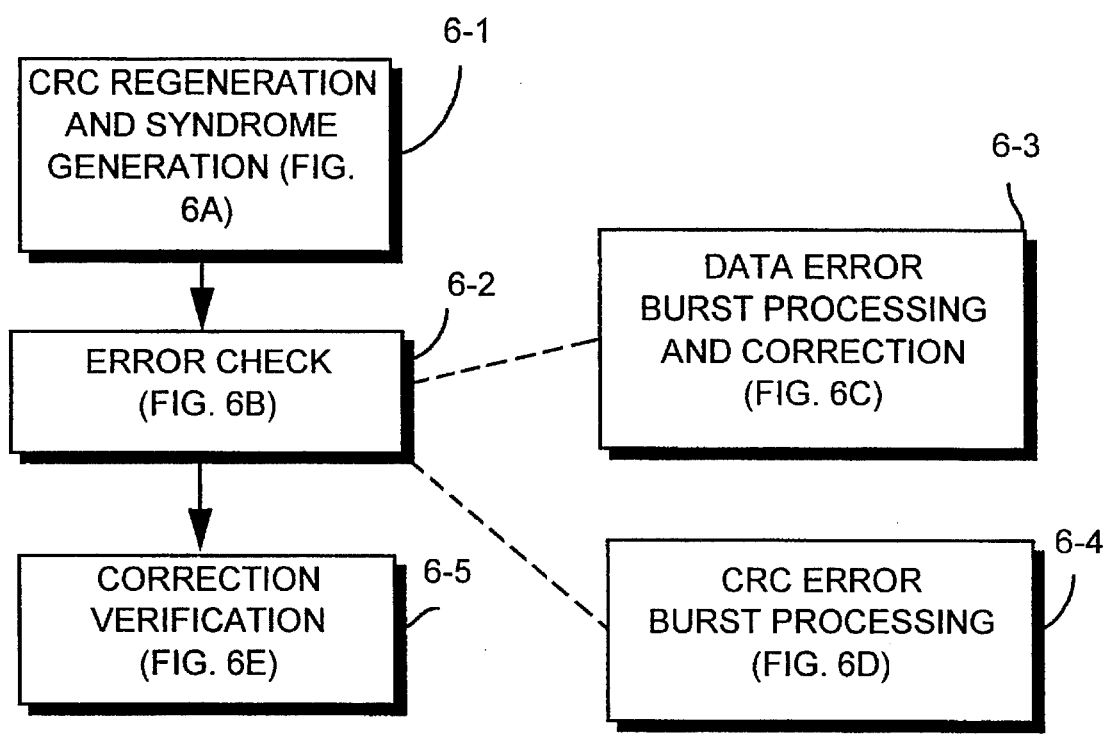
FIG. 6 is a state diagram showing states of the burst error correction system of FIG. 1 during a read operation for reading ECC-encoded data, and further shows relationships among FIGS. 6A, FIG. 6B, FIG. 6C, FIG. 6D, and FIG. 6E.
Figure 6A:
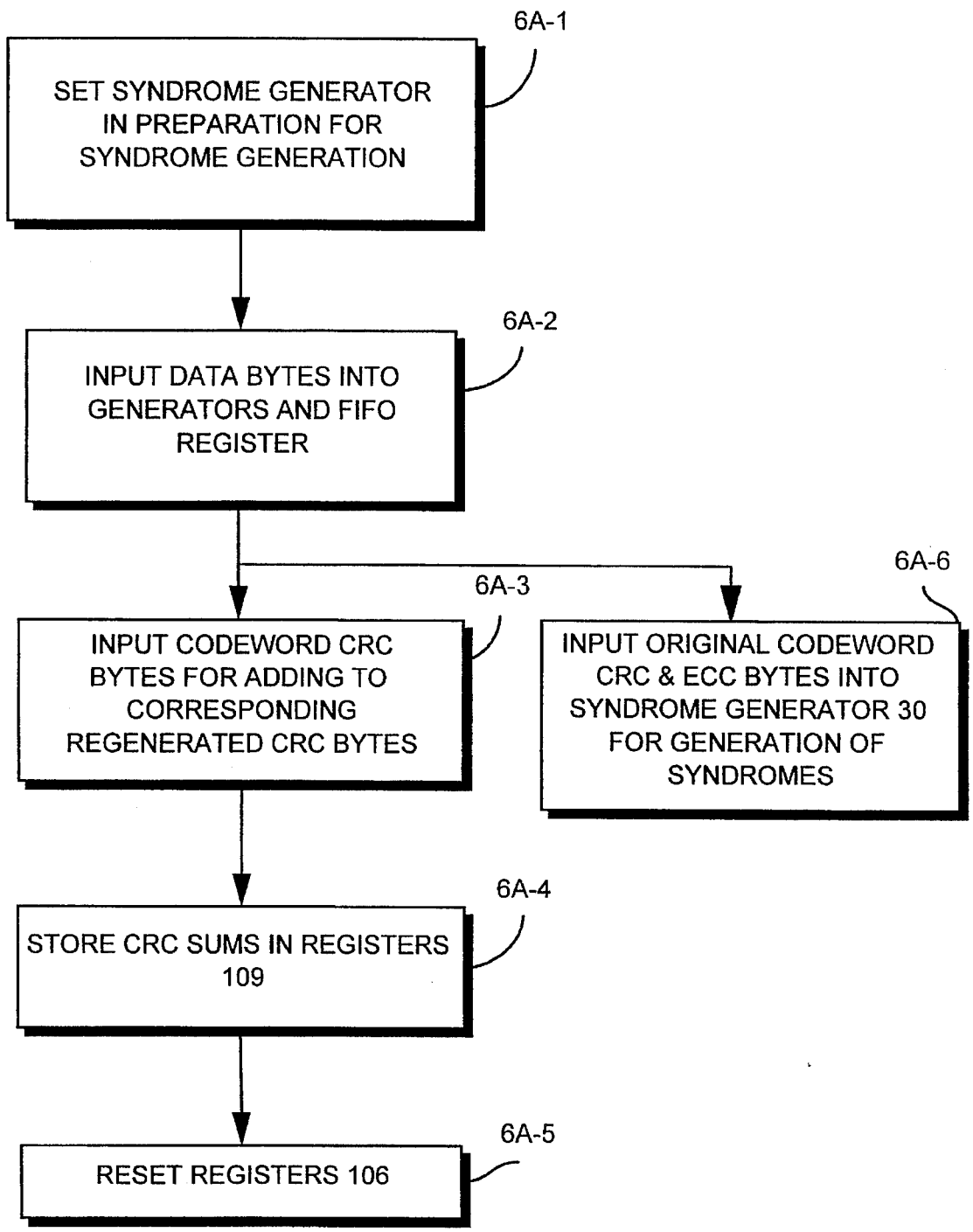
FIG. 6A shows steps executed by the burst error correction system of FIG. 1 during a CRC regeneration and syndrome generation state.

FIG. 6 shows states assumed by the burst error correction system of the present invention during an operation of reading encoded data. In a first state 6-1, the entire codeword is inputted for the purpose of regenerating CRC bytes using CRC generator/checker 20 and for generating syndromes using syndrome/ECC generator 30. General steps executed in connection with state 6-1 are illustrated in FIG. 6A.

Figure 6B:
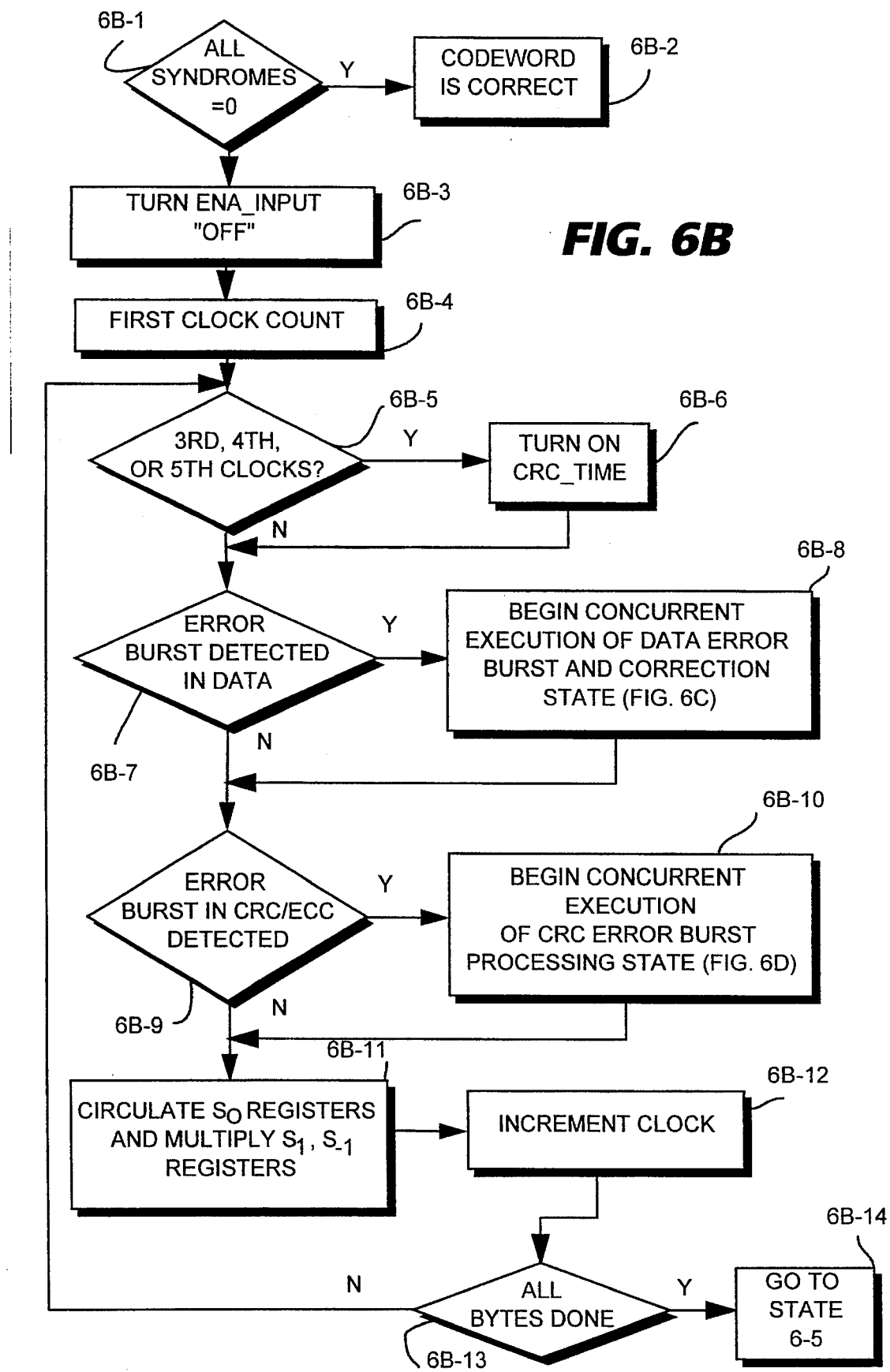
FIG. 6B shows steps executed by the burst error correction system of FIG. 1 during an error check state.

In state 6-2, the syndromes generated in state 6-1 are utilized to determine if an error burst has occurred. As explained in more detail below, an error burst can occur entirely in the data portion of the codeword, entirely in the CRC portion of the codeword, or can bridge the data portion and CRC portion of the codeword (e.g., one or two bytes of data and one or two bytes of CRC). General steps executed in connection with state 6-2 are illustrated in FIG. 6B.

Figure 6C:
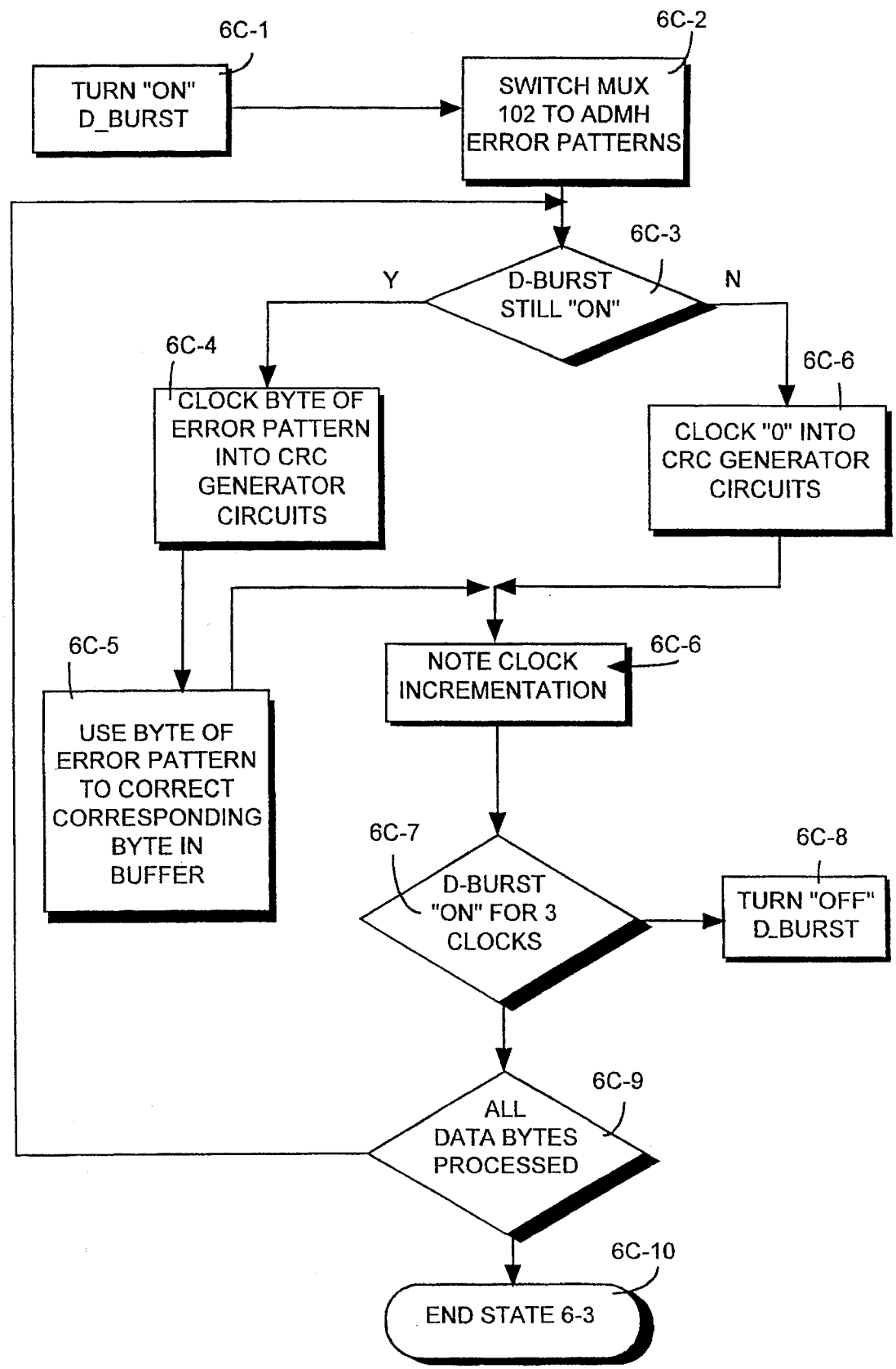
FIG. 6C shows steps executed by the burst error correction system of FIG. 1 during a data error burst processing and correction state.

When at least a portion of an error burst occurs in the data portion of the codeword, a data error burst processing & correction state (i.e., state 6-3) is begun. The data error burst processing & correction state involves applying the error pattern, for the next three clocks, to CRC generator/checker 20 for generating further CRC bytes over the error pattern. General steps executed in connection with state 6-3 are illustrated in FIG. 6C.

When a portion of the error data burst occurs in the CRC portion of the codeword, a CRC error burst processing state (i.e., state 6-4) is begun. The CRC error burst processing state involves applying the error pattern bytes developed during a phase of operation known as CRC_TIME to CRC generator/checker 20 for the purpose of adding the error pattern with the regenerated CRC bytes (as developed in state 6-1). As subsequently determined in a correction verification state (state 6-5), if the burst error occurred only in the CRC portion of the codeword, the result of the addition will be zero if the codeword is correctable.

If the burst error bridged the data portion of the codeword and the CRC portion of the codeword, state 6-4 (CRC error burst processing state) is first begun and state 6-3 (data error burst processing & correction state) thereafter is entered. In state 6-4 (CRC error burst processing state), CRC generator/checker adds the portion of the error pattern outputted during CRC_TIME with the CRC check remainder bytes (as developed in state 6-1). As subsequently determined in a correction verification state (state 6-5), if the codeword is deemed correctable the result must equal the CRC bytes generated over the data portion of the error pattern.

As indicated above, after attempted correction of the codeword and after state 6-2, state 6-5 is executed for the purpose of verifying the correction. General steps executed in connection with state 6-5 are illustrated in FIG. 6E.

OPERATION: BURST ERROR MATHEMATICS

On receiving a possibly corrupted codeword, R(X), CRC check bytes are generated by regenerating CRCs from the data portion of R(X) and adding (XORing) them to the CRC portion of R(X). Also five syndromes are generated. They are $S_{-1}$, $S_1$, $S_{00}$, $S_{01}$ and $S_{02}$ where $$S_k = R(X) X \mod(X + \alpha^k), \quad k = -1, 1$$

and $$S_{0k} = \sum_{n=0}^{i_k} C_{3n+k}, \quad k = 0, 1, 2$$

$S_{00}$, $S_{01}$ and $S_{02}$ a are the parity sums over the three interleaves. $S_{00}$ is the sum over the interleave which contains the last codeword byte, $C_0$. $S_{01}$ is the sum over the interleave which contains $C_1$ and $S_{02}$ is the sum over the interleave which contains $C_2$. An error burst occupying no more than three bytes will be contained in $S_{00}$, $S_{01}$ and $S_{02}$ but possible circularly shifted. Let $e_2$ be the first byte of the error burst, $e_1$ be the (possibly zero) second byte of the error burst and $e_0$ be the (possibly zero) last byte of the error burst. If there are k error-free bytes in R(X) following the three byte error burst then at the completion of syndrome generation we have:

$$S_1 = (e_2\alpha^2 + e_1\alpha + e_0)\alpha^{k+1}$$

and $$S_{-1} = (e_2\alpha^{-2} + e_1\alpha^{-1} + e_0)\alpha^{-(k+1)} = (e_2 + e_1\alpha + e_0\alpha^2)\alpha^{-(k+3)}.$$

Since there are s+m+5 bytes in the codeword there will be s+m+2-k error-free bytes before the start of the error burst. Let r be (s+m+5)mod 3. Let $S_{00}$, $S_{01}$ and $SR_{02}$ correspond to the $S_0$ registers circularly shifted ($S_{00}$ to $S_{01}$, $S_{01}$ to $S_{02}$ and $S_{02}$ to $S_{00}$) 3–r times, i.e.

$SR_{00} = S_{00}$ if r=0, $S_{01}$ if r=1 and $S_{02}$ if r=2

$SR_{01} = S_{01}$ if r=0, $S_{02}$ if r=1 and $S_{00}$ if r=2

$SR_{02} = S_{02}$ if r=0, $S_{00}$ if r=1 and $S_{01}$ if r=2.

The SR bytes are the outputs of three MUXes. By circularly shifting the SO registers s+m+2–k times $SR_{00}$ will be $e_0$, $SR_{01}$ will be $e_1$ and $SR_{02}$ will be $e_2$.

Correction begins immediately following syndrome generation. At each step two pairs of values are computed and compared with each other to detect the start of an error. The four values are:

$$V_1 = SR_{00} + SR_{01}\alpha + SR_{02}\alpha^2$$

$$V_{-1} = SR_{00}\alpha^2 + SR_{01}\alpha + SR_{02}$$

$$W_1 = S_1\alpha^{-(s+m+3)}$$

$$W_{-1} = S_{-1}\alpha^{s+m+5}$$

The start of an error burst is detected when $V_1 = W_1$ and $V_{-1} = W_{-1}$. One data byte is output on each step. When an error burst is detected then the current data byte is XORed with the current error pattern, from $SR_{02}$, to effect correction. Also the error pattern is used to generate error CRC bytes. Between steps the $S_0$ registers are circularly shifted, $S_1$ is multiplied by $\alpha$ and $S_{-1}$ is multiplied by $\alpha^{-1}$. After s+m+2-k clocks (steps) $V_1 = W_1 = e_0 + e_1\alpha + e_2\alpha^2$ and $V_{-1} = W_{-1} = e_2 + e_1\alpha + e_0\alpha^2$. For minimum latency, if an uncorrectable error has occurred it must be detected immediately following the correction of the data portion of R(X). An uncorrectable error is detected if the error CRC bytes generated during correction do not match the CRC check bytes generated during syndrome generation. An uncorrectable error is also detected if the syndromes were not all zero but an error burst was not detected during the correction phase. This last condition can only be checked if every byte position, including the CRC/ECC byte positions, was checked for the start of an error burst. This means that the CRC/ECC positions must be checked at the same time that the data byte positions are being checked. This is accomplished by comparing $V_1$ to $W_1\alpha^{3j}$ and comparing $V_1$ to $W_{-1}\alpha^{-3j}$. These comparisons are made in order to detect the start of a burst in the CRC/ECC portion and are in addition to the comparisons needed for burst detection in the data portion. These new comparisons check locations 3j bytes ahead of the current position. j is chosen so that 3j is not more than s−2 and not less than m+3. In the illustrated embodiment, s=8, m=3, and j=2. In certain cases where the number of redundancy bytes is greater than the number of data bytes the second constraint cannot be met. In these cases some additional clocks will be needed to finish checking the redundancy locations after data correction is finished.

READING OPERATION: CRC/SYNDROME GENERATION

FIG. 6A illustrates general steps involved in state 6-1 (e.g., inputting the entire codeword for the purpose of regenerating CRC bytes using CRC generator/checker 20 and for generating syndromes using syndrome/ECC generator 30).

At step 6A-1 of state 6-1, syndrome/ECC generator 30 is set for syndrome generation. In this regard, during syndrome generation, signal ENA_INPUT is on and signal ENA_PARITY is off. MUXes 216, 217 and 218 connect adders 202, 203 and 204, respectively, to multiplier 212, register 219 and multiplier 213, respectively. MUXes 210 and 211 connect the outputs of multipliers 212 and 213, respectively, to the inputs of registers 214 and 215, respectively.

At step 6A-2, all data bytes of the codeword are input to the generators 20, 30 and to FIFO register (buffer) 296 (see read data signal RD DATA in FIG. 2 and FIG. 4). Inputting the data bytes into CRC generator/checker 20 enables generator 20 to regenerate CRC bytes over the read data. Application of the data bytes of the codeword to syndrome/ECC generator 30 enables generator 30 to being generation of syndromes. Loading the data bytes into FIFO register 296 puts the data bytes in a location where they can be operated upon, if necessary, during a correction operation (specifically, during the data error burst processing & correction state [state 6-3]).

In connection with the input of data at step 6A-2 to generator 20, data bytes are presented to the individual CRC generators via MUXes 100, 101, 102 and 103. MUX 107 connects register $106_2$ to adder $108_2$. While data bytes are being presented, MUXes 104 connect the outputs of the feedback multipliers 105 to the inputs of registers 106 which are initially reset.

Steps 6A-3, 6A-4, and 6A-5 are executed by CRC generator/checker 20 while step 6A-6 is being executed by syndrome/ECC generator 30. At step 6A-3, the original CRC bytes from the codeword are inputted into CRC generator/checker 20 and are added to corresponding ones of the CRC bytes regenerated at step 6A-2. The resultant sums are CRC bytes over any error in the codeword.

Describing the operation of generator 20 in more detail during step 6A-3, while the three CRC bytes of the codeword are being input to generator 20, MUXes 104 switch to allow the regenerated CRC bytes stored in the registers 106 to be shifted out through MUX 107 to adder $108_2$ where they are added to the incoming CRC bytes. The output of adder $108_2$ is shifted into registers 109. These three bytes are the CRC check bytes and are zero if no errors occurred.

At step 6A-4, the sums resulting from the addition of step 6A-3 (CRC bytes over any error in the codeword) are stored in registers 109. Thereafter, at step 6A-5, registers 106 are reset.

As mentioned above, step 6A-6 is by ECC/syndrome generator 30 concurrently with execution of step 6A-3 through 6A-5 by CRC generator/checker 20. Step 6A-6 involves inputting the original codeword CRC and ECC bytes into ECC/syndrome generator 30 for generation of syndromes. The connections of ECC/syndrome generator 30 for syndrome generation are aforedescribed by step 6A-1. Upon completion of step 6A-6, syndrome $S_1$, $S_{00}$, $S_{01}$, $S_{02}$, and $S_{-1}$ are stored in registers 214, 219, 222, 223, and 215, respectively (see FIG. 3).

READING OPERATION: BURST ERROR CHECKING

FIG. 6B illustrates general steps involved in state 6-2 (e.g., utilizing the syndromes generated in state 6-1 to determine if an error burst has occurred). As a first step 6B-1, if all syndromes $S_1$, $S_{00}$, $S_{01}$, $S_{02}$, and $S_{-1}$ are zero, there is no error and processing of the codeword terminates at step 6B-2. No error in the codeword means that the data bytes in FIFO register 296 are correct and can be utilized for their intended purpose (e.g, as sector header information, such as sector IDs, as explained in simultaneously-filed U.S. patent application Ser. No. 08/326,126 entitled "ERROR CORRECTION METHOD AND APPARATUS" incorporated herein by reference).

Assuming all syndromes are not zero, the burst error correction system of the present invention then begins a series of clocked operations for correcting the codeword. Each clock corresponds to a data byte of the codeword.).

At step 6B-3, the signal ENA_INPUT is turned OFF. The MUX selects remain as for syndrome generation. This allows the $S_0$ registers to circularly shift, the $S_1$ register to be multiplied by $\alpha$, and the $S_{-1}$ register to be multiplied by $\alpha^{-1}$ on each clock.

At step 6B-4, clocking begins with the first clock count. Thereafter, a potential loop comprising steps 6B-5 through 6B-13 is executed. In view of the fact that execution potentially loops back to step 6B-5 after a clock incrementation, step 6B-5 checks to determine if the clocking has reached the 3rd, 4th, or 5th clocks. If the determination at step 6B-6 is affirmative, at step a signal CRC_TIME is turned ON to indicate the beginning of state 6-4. CRC_TIME is set during the third, fourth and fifth correction clock cycles because the first location that is checked by the ECHK's (see FIG. 4) is the seventh location (six ahead of the first byte). The CRC bytes start in the ninth location.

At step 6B-7, a determination is made by the circuit of FIG. 4 whether an error burst occurred in the data portion of the codeword. The start of an error burst in the data portion is detected when $DCHK_1$ and $DCHK_{-1}$ in FIG. 4 both turn on. When the start of an error burst in the data portion is detected, the data error burst processing & correction state (state 6-3 of FIG. 6C) is begun (as indicated by step 6B-8) concurrently and in timed relation with state 6-2 of FIG. 6B.

At step 6B-9, a determination is made by the circuit of FIG. 4 whether an error burst occurred in the CRC portion of the codeword. The start of an error burst in the CRC/ECC portion is detected when $ECHK_1$ and $ECHK_{-1}$ both turn on. When the start of an error burst in the CRC portion is detected, the CRC error burst processing state (state 6-4 of FIG. 6D) is begun (as indicated by step 6B-10) concurrently and in timed relation with state 6-2 of FIG. 6B, and possibly concurrently and in timed relation with state 6-3 of FIG. 6C.

Whether or not one or more of states 6B-3 and 6B-4 have begun, state 6B-2 continues with step 6B-11 wherein the $S_0$ registers are circulated and the $S_1$ and $S_{-1}$ registers are multiplied by their respective feedback constants. In this regard, the $S_0$ registers are circularly shift by one register during the clock; the $S_1$ register is multiplied by $\alpha$, and the $S_{-1}$ register is multiplied by $\alpha^{-1}$ on each clock.

At step 6B-12, the clock is incremented. If it is determined at step 6B-13 that all bytes of the codeword have been processed, state 6-2 is ended and state 6-5 is begun (step 6B-14). Otherwise, execution loops back to step 6B-5 as above described.

Thus, in addition to checking the syndromes at step 6B-1 to determine whether the codeword contains errors, state 6-2, if burst errors are encountered in the data portion of the codeword and/or the CRC portion of the codeword, state 6-2 kicks off concurrent execution of states 6-3 and 6-4, respectively.

READING OPERATION: DATA BURST CORRECTION

FIG. 6C illustrates general steps involved in state 6-3 (the data error burst processing & correction state). When the data error burst processing & correction state (state 6-3) is begun, at step 6C-1 the signal D_BURST is turned ON. D_BURST is set for three clocks allowing data being read from buffer 296 of FIG. 4 to be corrected as it is output.

At step 6C-2, MUX 102 in FIG. 2 switches to allow error patterns (from register $SR_{02}$) to become the input to the CRC generator circuits of FIG. 2. The other MUX selects are the same as for CRC generation.

Because step 6C-3 initiates a loop to which execution potentially returns, a check is made at step 6C-3 whether signal D_BURST is still on. If D_BURST is still on, at step 6C-4 a byte of the three-byte error pattern is added into registers 106 (via MUXes 103 and adders 105). In other words, when D_BURST is on registers 106 clock in the error patterns.

When D_BURST is on, at step 6D-4 the current byte of the error pattern obtained from register SR$_{02}$ is used to correct the corresponding byte in FIFO buffer 296. In this regard, at step 6D-4 adder 289 of FIG. 4 adds the corresponding data byte as shifted out of FIFO 296 to the error pattern byte from register SR$_{02}$, thereby performing correction of a previously erroneous data byte. (Since CRC bytes and ECC bytes are not utilized by a user, the CRC bytes and ECC bytes are not stored in FIFO buffer 296 since correction thereof is necessary from a user's perspective).

As an alternative to steps 6C-4 and 6C-5, if D_BURST has been turned off, at step 6C-6 zero is clocked into registers 106 of the CRC generator circuits of FIG. 2. That is, after D_BURST turns off the registers 106 continue clocking but with the input forced to zeros by gate 110.

At step 6C-6 an incrementation of the clock occurring at step 6B-12 of state 6-2 is noted. That is, the clock is incremented prior to reaching step 6C-7. Then, if it is determined at step 6B-7 that (after clock incrementation) the signal D_BURST has been on for three clocks, at step 6C-8 the signal D_BURST is turned OFF.

At step 6C-9 it is determined whether all data bytes of the codeword have now been processed. If all data bytes have been processed, state 6-3 ends (step 6C-10). In such case, after the eight clocks of correction, registers 106 will contain CRC bytes generated over errors occurring in the data. Otherwise, execution loops back to step 6C-3 for continued CRC generation (over either the error pattern or filling zeroes) and storage in registers 106.

READING OPERATION: CRC BURST CORRECTION/CHECKING

Figure 6D:
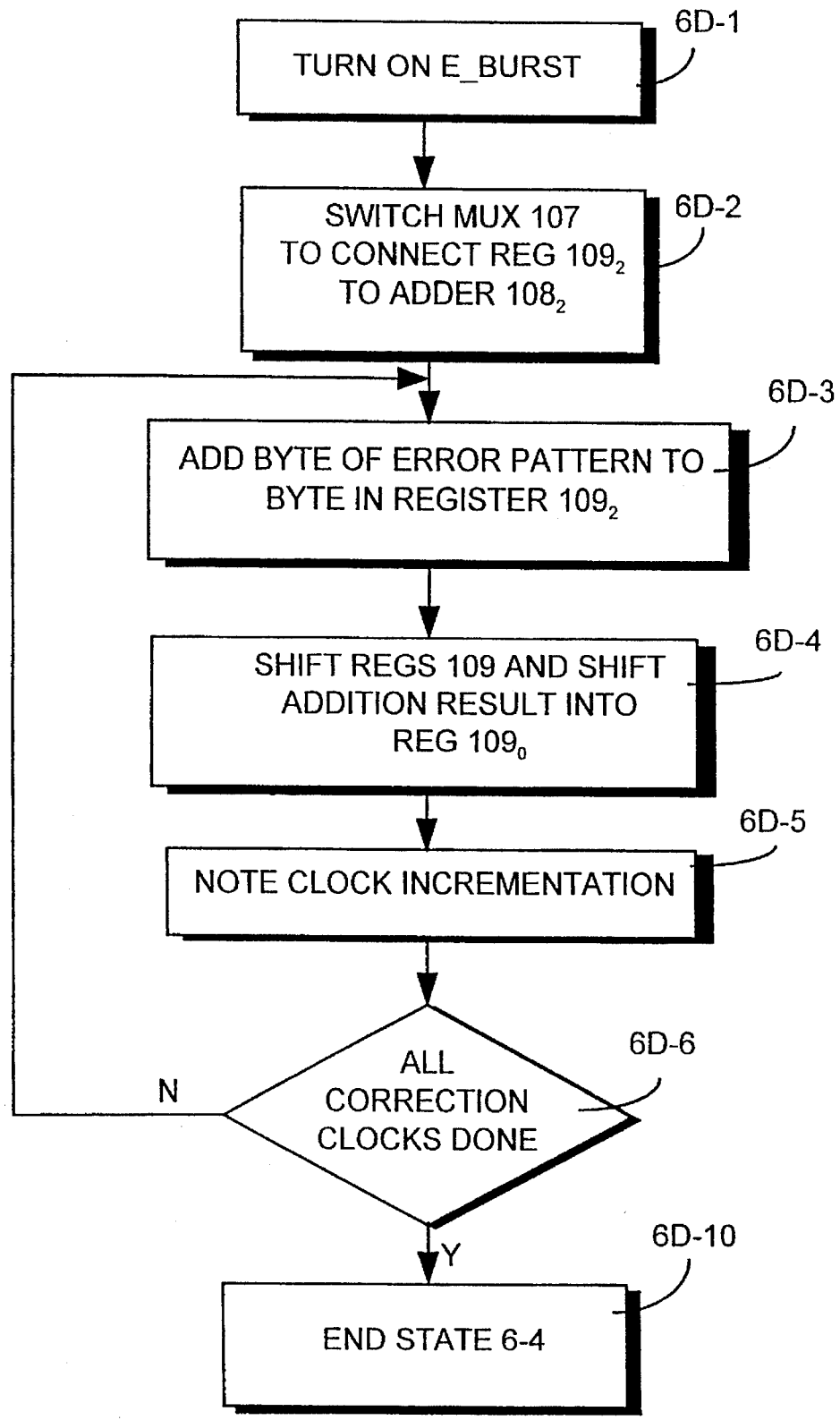
FIG. 6D shows steps executed by the burst error correction system of FIG. 1 during a CRC error burst processing state.
Figure 6E:
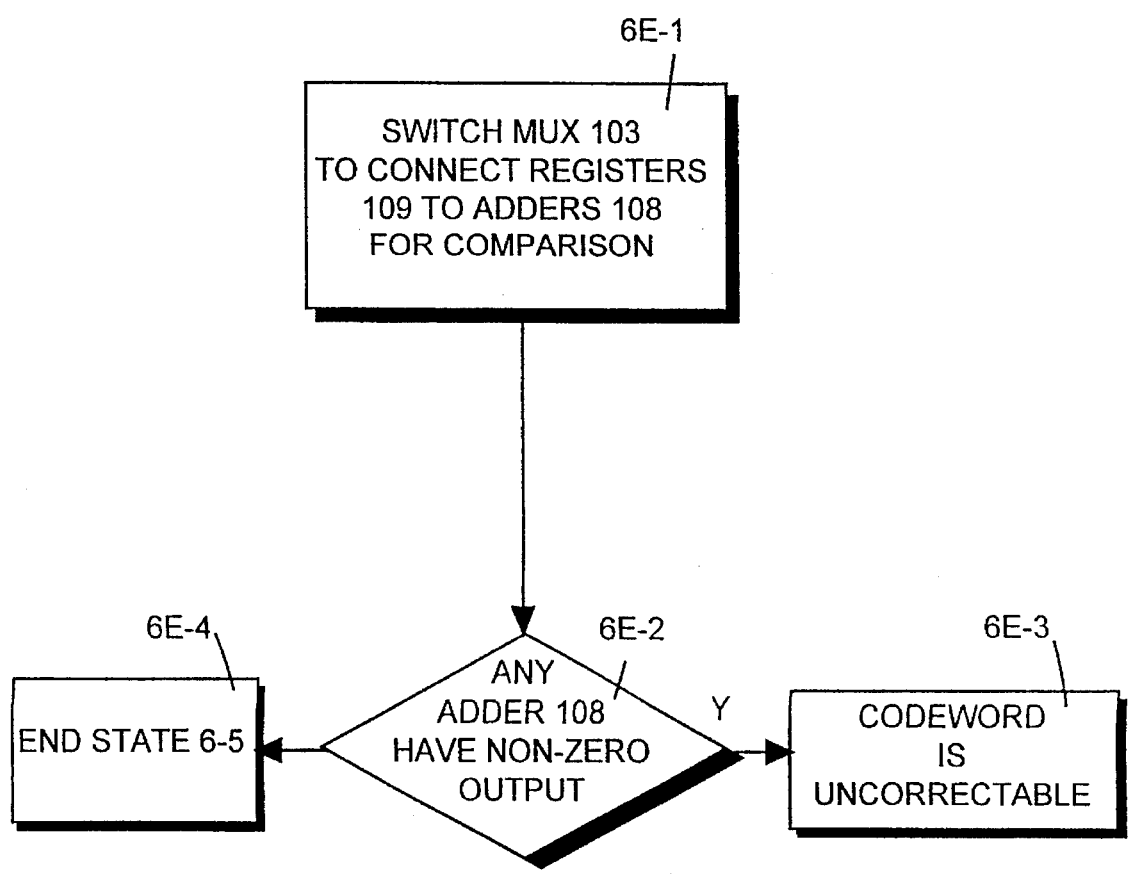
FIG. 6E shows steps executed by the burst error correction system of FIG. 1 during a correction verification.

FIG. 6D illustrates general steps involved in state 6-3 (the CRC error burst processing state). As explained above, state 6-3 may be entered during execution of state 6-2 if the error burst occurs only over the CRC bytes of the codeword. Alternatively, state 6-3 may be entered during execution of both state 6-2 and state 6-3 if the error burst bridges the data and CRC portions of the codeword.

At step 6D-1, the signal E_BURST is turned ON to denote an error in the CRC portion of the codeword. Then, at step 6D-2, MUX 107 is switched to connect register 109$_2$ to adder 108$_2$.

At step 6D-3, a byte of the error pattern (signal SR$_{02}$) is added to the byte in register 109$_2$. Then, at step 6D-4, registers 109 are shifted so that the contents of register 109$_1$ is shifted into register 109$_2$ and the contents of register 109$_0$ is shifted into register 109$_1$. Also at step 6D-4, the addition result of step 6D-3 is shifted into register 109$_0$.

At step 6D-5 an incrementation of the clock occurring at step 6B-12 of state 6-2 is noted. That is, the clock is incremented prior to reaching step 6D-6. At step 6D-6, it is determined whether all correction clocks are done. If all correction clocks are not done, execution loops back to step 6D-3 so that another byte of the error pattern can be processed (i.e., added at adder 108$_2$). In this regard, it will be understood that the next byte of the error pattern is outputted from register SR$_{02}$ and is obtained from the circulation of the S$_0$ registers which is occurred in step 6B-11 of concurrent state 6B-2. If all correction clocks have expired, state 6D-4 is terminated (step 6D-10).

Thus, in summary, during state 6-4, while CRC_TIME is on the registers 109 shift to the right. If E_BURST is on while CRC_TIME is on, then errors have occurred in the CRC bytes and the CRC check bytes in registers 109 are corrected by having MUX 107 connect register 109$_2$ to adder 108$_2$.

READING OPERATION: CORRECTION VERIFICATION

FIG. 6E illustrates general steps involved in state 6-5 (the correction verification state). At step 6E-1, MX 103 is switched so as to connect registers 109 to adders 108. If the error burst occurred only in the CRC portion of the codeword, and if the codeword was properly corrected, registers 109 should be zero (as are registers 106, registers 106 having been reset and not used for syndrome generation since state 6-3 was not entered). If the error burst bridged the data and CRC portions of the codeword, the error over CRC should have been removed from registers 109 at step 6D-4, with the result that only CRC over error patterns over the data portion of the codeword should reside in registers 109. Since the registers 106 contain CRCs regenerated over the error pattern for the data portion of the codeword, registers 106 and 109 will cancel out if the codeword is correctable.

At step 6E-2 OR gate 112 checks whether any adder 108 has a non-zero output. If any adder 108 has a non-zero output, the codeword is deemed uncorrectable (step 6E-3). If the output of OR gate 112 is zero, then the codeword is deemed correctable and state 6-5 is concluded (step 6E-4).

Thus, in correction verification state 6-5, as bytes shift out of register 109$_2$, the error pattern is added to them and the result shifted into register 109$_0$. After the eight clocks of correction, registers 109 should match registers 106. This check is made by switching MUXes 103 to connect registers 109 to adders 108. The adder outputs are checked by OR gates 111. Any non-zero bytes indicate an uncorrectable error.

In the disk drive environment, when it is desired to write a sector it is first necessary to find the area to write to by reading header fields until the target sector (i.e. the one immediately preceding the data area to be written to) is found. However, before each header can be used it must be corrected or determined to be uncorrectable (in which case it is not usable). During the time this processing is occurring the head is traversing the gap on the disk between the header area and data area. To minimize the size of this wasted disk space it is desirable to complete the processing in the minimum amount of time. Assuming there are n header bytes (i.e. non-redundancy bytes) in the header field, the present invention begins correction of the header bytes on the next clock after the header field has been read, corrects the header bytes in n clocks, and concurrently determines whether or not the header field is correctable by determining whether or not the error pattern generated (in data or redundancy) is consistent with all of the redundancy bytes in the header field. It does this by checking for errors in the redundancy bytes at the same time that it is correcting the header bytes.

While the invention has been particularly shown and described with reference to the preferred embodiments thereof, it will be understood by those skilled in the art that various alterations in form and detail may be made therein without departing from the spirit and scope of the invention.

TABLE 1

Multiplication by $\alpha^{-14}$:

OUT0 = IN2 + IN4 + IN5 + IN6 + IN7
OUT1 = IN3 + IN5 + IN6 + IN7

TABLE 1-continued

Multiplication by $\alpha^{-14}$:

OUT2 = IN2 + IN5
OUT3 = IN0 + IN2 + IN3 + IN4 + IN5 + IN7
OUT4 = IN0 + IN1 + IN2 + IN3 + IN7
OUT5 = IN1 + IN2 + IN3 + IN4
OUT6 = IN0 + IN2 + IN3 + IN4 + IN5
OUT7 = IN1 + IN3 + IN4 + IN5 + IN6

TABLE 2

Multiplication by $\alpha^{-6}$:

OUT0 = IN3 + IN4 + IN6
OUT1 = IN0 + IN4 + IN5 + IN7
OUT2 = IN0 + IN1 + IN3 + IN4 + IN5
OUT3 = IN1 + IN2 + IN3 + IN5
OUT4 = IN0 + IN2
OUT5 = IN0 + IN1 + IN3
OUT6 = IN1 + IN2 + IN4
OUT7 = IN2 + IN3 + IN5

TABLE 3

Multiplication by $\alpha^{-3}$:

OUT0 = IN0 + IN1 + IN3
OUT1 = IN1 + IN2 + IN4
OUT2 = IN0 + IN1 + IN2 + IN5
OUT3 = IN0 + IN2 + IN6
OUT4 = IN7
OUT5 = IN0
OUT6 = IN1
OUT7 = IN0 + IN2

TABLE 4

Multiplication by $\alpha^{-1}$:

OUT0 = IN1
OUT1 = IN0 + IN2
OUT2 = IN0 + IN3
OUT3 = IN0 + IN4
OUT4 = IN5
OUT5 = IN6
OUT6 = IN7
OUT7 = IN0

TABLE 5

Multiplication by $\alpha^1$:

OUT0 = IN7
OUT1 = IN0
OUT2 = IN1 + IN7
OUT3 = IN2 + IN7
OUT4 = IN3 + IN7
OUT5 = IN4
OUT6 = IN5
OUT7 = IN6

TABLE 6

Multiplication by $\alpha^2$:

OUT0 = IN6
OUT1 = IN7
OUT2 = IN0 + IN6
OUT3 = IN1 + IN6 + IN7
OUT4 = IN2 + IN6 + IN7

TABLE 6-continued

Multiplication by $\alpha^2$:

OUT5 = IN3 + IN7
OUT6 = IN4
OUT7 = IN5

TABLE 7

Multiplication by $\alpha^3$:

OUT0 = IN5
OUT1 = IN6
OUT2 = IN5 + IN7
OUT3 = IN0 + IN5 + IN6
OUT4 = IN1 + IN5 + IN6 + IN7
OUT5 = IN2 + IN6 + IN7
OUT6 = IN3 + IN7
OUT7 = IN4

TABLE 8

Multiplication by $\alpha^4$:

OUT0 = IN4
OUT1 = IN5
OUT2 = IN4 + IN6
OUT3 = IN4 + IN5 + IN7
OUT4 = IN0 + IN4 + IN5 + IN6
OUT5 = IN1 + IN5 + IN6 + IN7
OUT6 = IN2 + IN6 + IN7
OUT7 = IN3 + IN7

TABLE 9

Multiplication by $\alpha^6$:

OUT0 = IN2 + IN6 + IN7
OUT1 = IN3 + IN7
OUT2 = IN2 + IN4 + IN6 + IN7
OUT3 = IN2 + IN3 + IN5 + IN6
OUT4 = IN2 + IN3 + IN4
OUT5 = IN3 + IN4 + IN5
OUT6 = IN0 + IN4 + IN5 + IN6
OUT7 = IN1 + IN5 + IN6 + IN7

TABLE 10

Multiplication by $\alpha^{16}$:

OUT0 = IN2 + IN5 + IN7
OUT1 = IN3 + IN6
OUT2 = IN0 + IN2 + IN4 + IN5
OUT3 = IN0 + IN1 + IN2 + IN3 + IN6 + IN7
OUT4 = IN1 + IN3 + IN4 + IN5
OUT5 = IN2 + IN4 + IN5 + IN6
OUT6 = IN0 + IN3 + IN5 + IN6 + IN7
OUT7 = IN1 + IN4 + IN6 + IN7

TABLE 11

Multiplication by $\alpha^{236}$:

OUT0 = IN0 + IN1 + IN2 + IN7
OUT1 = IN0 + IN1 + IN2 + IN3
OUT2 = IN3 + IN4 + IN7
OUT3 = IN0 + IN1 + IN2 + IN4 + IN5 + IN7
OUT4 = IN3 + IN5 + IN6 + IN7
OUT5 = IN4 + IN6 + IN7
OUT6 = IN0 + IN5 + IN7

TABLE 11-continued

Multiplication by $\alpha^{236}$:

OUT7 = IN0 + IN1 + IN6

TABLE 12

Multiplication by $\alpha^{243}$:

OUT0 = IN0 + IN2 + IN3 + IN4 + IN5
OUT1 = IN1 + IN3 + IN4 + IN5 + IN6
OUT2 = IN0 + IN3 + IN6 + IN7
OUT3 = IN0 + IN1 + IN2 + IN3 + IN5 + IN7
OUT4 = IN0 + IN1 + IN5 + IN6
OUT5 = IN0 + IN1 + IN2 + IN6 + IN7
OUT6 = IN0 + IN1 + IN2 + IN3 + IN7
OUT7 = IN1 + IN2 + IN3 + IN4

The embodiments of the invention in which an exclusive property or privilege is claimed are defined as follows:

1. An error correction system for detecting an error burst in a received codeword, the system comprising:
   a CRC generator for generating check CRC bytes over data bytes of the codeword;
   a syndrome generator which uses the data bytes of the codeword and CRC bytes of the codeword to generate syndromes and an error pattern;
   a error corrector which uses the syndromes to determine the beginning of an error burst in the codeword and which uses the error pattern to correct the codeword;
   a checker unit which uses the error pattern and the check CRC bytes generated by the CRC generator for verifying that the codeword is correctable.

2. The apparatus of claim 1, wherein the codeword includes header information read from storage media.

3. The apparatus of claim 2, wherein the header information includes identification of a sector stored on the media.

4. The apparatus of claim 1, wherein the checker unit adds the check CRC bytes with the CRC bytes of the codeword to obtain CRC check remainder bytes.

5. The apparatus of claim 4, wherein the checker unit verifies that the codeword is correctable if: (1) the error burst is detected by the error corrector to have begun in the CRC bytes of the codeword, and (2) the CRC check remainder bytes are all zero.

6. The apparatus of claim 4, wherein, when the error burst is detected by the error corrector to have begun in the data bytes of the codeword, the checker unit generates CRC bytes over the error pattern and compares the CRC bytes generated over the error pattern with the CRC check remainder bytes.

7. The apparatus of claim 6, wherein if the error burst began in the data bytes of the codeword and continued to the CRC bytes of the codeword, the correction of the codeword is verified by the checker unit if the CRC check remainder bytes equal the CRC bytes generated over the error pattern.

8. The apparatus of claim 4, wherein the checker unit verifies that the codeword is correctable if the CRC check remainder bytes are all zero.

9. The apparatus of claim 1, wherein the error corrector detects a three byte error burst in the codeword.

10. A codeword generator for generating electrical signals corresponding to a codeword, the codeword generator comprising:
    means for receiving data bytes and outputting electrical signals corresponding to the received data bytes as a first component of the codeword;
    a CRC generator which uses the received data bytes to generate electrical signals corresponding to m number of cyclical redundancy bytes as a second component of the codeword; and
    an ECC generator which uses the received data bytes and the cyclical redundancy bytes to generate electrical signals corresponding to a plurality of error correction bytes as a third component of the codeword, the ECC generator configured to group the data bytes and the m number of CRC bytes into L number of interleaves, wherein L number of the plurality of error correction bytes are such that a sum of bytes in a corresponding interleave for a codeword is zero, and wherein the error correction bytes generated by the ECC generator constitute a plurality of roots of the codeword.

11. The apparatus of claim 10, wherein the error correction bytes generated by the ECC generator constitute at least L number of consecutive roots of the codeword.

12. The apparatus of claim 10, wherein the ECC generator generates five error correction bytes, the five error correction bytes being generated to cause each interleave to have $\alpha^0$ as a root and to cause the codeword to have $\alpha^1$ and $\alpha^{-1}$ as a root.

13. The apparatus of claim 10, wherein the ECC generator comprises an interleave-dependent ECC factor sub-generator, the interleave dependent ECC factor sub-generator operating in accordance with clock cycles and comprising:
    L number of interleave parity sum registers;
    an adder for adding an input byte applied to the interleave-dependent ECC factor sub-generator to contents of a selected one of the interleave parity sum registers during a clock cycle;
    the interleave parity sum registers being connected whereby each interleave parity sum register has an input byte added thereto by the adder every Lth clock cycle.

14. The apparatus of claim 13, wherein the ECC generator further comprises at least one interleave-independent ECC factor sub-generator for generating an interleave-independent ECC factor; and wherein the interleave-independent ECC factor is transferred into at least one of the interleave parity sum registers in a process of outputting the error correction bytes from the ECC generator.

15. The apparatus of claim 14, wherein the ECC generator generates five error correction bytes $E_0$–$E_4$, wherein there are first and second interleave-independent ECC factor sub-generators, wherein the interleave-dependent ECC factor sub-generator generates bytes $E_2$–$E_4$ and wherein ECC factors generated by the first and second interleave-independent ECC factor sub-generators are used to generate error correction byte $E_0$ and error correction byte $E_1$.

16. The apparatus of claim 14, wherein the interleave-independent ECC factor sub-generator includes an $S_1$ syndrome generator, the $S_1$ syndrome generator comprising:
    a $S_1$ syndrome register;
    a $S_1$ syndrome first adder connected to add together contents of the $S_1$ syndrome register and an input byte applied to the $S_1$ syndrome generator;
    a $S_1$ syndrome first feedback multiplier for multiplying the output of the $S_1$ syndrome first adder by a first multiplication constant;
    a $S_1$ syndrome second adder for adding a multiple of a parity sum to the input byte applied to the $S_1$ syndrome generator when the input byte applied to the $S_1$ syndrome generator is any of the last three bytes of the codeword immediately preceding error correction bytes.

17. The apparatus of claim 16, wherein the interleave-independent error correction byte sub-generator includes an $S_{-1}$ syndrome generator, the $S_{-1}$ syndrome generator comprising:

a $S_{-1}$ syndrome register;

a $S_{-1}$ syndrome first adder connected to add together contents of the $S_{-1}$ syndrome register and an input byte applied to the $S^{-1}$ syndrome generator;

a $S_{-1}$ syndrome first feedback multiplier for multiplying the output of the $S_{-1}$ syndrome first adder by a first multiplication constant;

a $S_{-1}$ syndrome second adder for adding a multiple of a parity sum to the input byte applied to the $S_{-1}$ syndrome generator when the input byte applied to the $S_{-1}$ syndrome generator is any of the last three bytes of the codeword immediately preceding error correction bytes.

18. The apparatus of claim 17, wherein the first multiplication constant of the $S_1$ generator is $\alpha^1$ and the first multiplication constant of the $S_{-1}$ generator is $\alpha^{-1}$.

19. A method of correcting errors in a digital data stream retrieved from a disk drive storage device, the method comprising:

receiving data bytes from the disk drive storage device and outputting the data bytes as a first component of a codeword;

using the received data bytes to generate electrical signals corresponding to m number of cyclical redundancy (CRC) bytes as a second component of the codeword; and grouping the data bytes and the m number of CRC bytes into L number of interleaves;

using the grouped data bytes and CRC bytes to generate electrical signals corresponding to a plurality of error correction bytes, wherein L number of the plurality of error correction bytes are such that a sum of bytes in a corresponding interleave for a codeword is zero, and wherein the error correction bytes constitute a plurality of roots of the codeword.

20. The method of claim 19, wherein the error correction bytes constitute at least L number of consecutive roots of the codeword.

21. The method of claim 19, wherein five error correction bytes are generated, the five error correction bytes being generated to cause each interleave to have $\alpha^0$ as a root and to cause the codeword to have $\alpha^1$ and $\alpha^{-1}$ as a root.

22. An error correction method for detecting an error burst in a received codeword, the method comprising:

generating check CRC bytes over data bytes of the codeword;

using the data bytes of the codeword and CRC bytes of the codeword to generate syndromes and an error pattern;

using the syndromes to determine the beginning of an error burst in the codeword and using the error pattern to correct the codeword;

using the error pattern and the check CRC bytes to verify that the codeword is correctable.

23. The method of claim 22, wherein the codeword includes header information read from storage media.

24. The method of claim 23, wherein the header information includes identification of a sector stored on the media.

25. The method of claim 22, wherein the check CRC bytes are added to the CRC bytes of the codeword to obtain CRC check remainder bytes.

26. The method of claim 25, wherein the codeword is verified as correctable if: (1) the error burst is detected to have begun in the CRC bytes of the codeword, and (2) the CRC check remainder bytes are all zero.

27. The method of claim 25, wherein, when the error burst is detected to have begun in the data bytes of the codeword:

CRC bytes are generated over the error pattern; and the CRC bytes generated over the error pattern are compared with the CRC check remainder bytes.

28. The method of claim 27, wherein if the error burst began in the data bytes of the codeword and continued to the CRC bytes of the codeword, the correction of the codeword is verified by if the CRC check remainder bytes equal the CRC bytes generated over the error pattern.

29. The method of claim 22, wherein the method detects a three byte error burst in the codeword.

* * * * *